(12) United States Patent
Dionne et al.

(10) Patent No.: US 11,363,748 B2
(45) Date of Patent: Jun. 14, 2022

(54) PRINTED CIRCUIT BOARD TRANSPORT

(71) Applicant: Universal Instruments Corporation, Conklin, NY (US)

(72) Inventors: Peter Joseph Dionne, Binghamton, NY (US); John Edward Danek, Vestal, NY (US); Koenraad Alexander Gieskes, Deposit, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 205 days.

(21) Appl. No.: 16/640,079

(22) PCT Filed: Aug. 22, 2018

(86) PCT No.: PCT/US2018/047538
§ 371 (c)(1),
(2) Date: Feb. 19, 2020

(87) PCT Pub. No.: WO2019/040629
PCT Pub. Date: Feb. 28, 2019

(65) Prior Publication Data
US 2020/0205322 A1     Jun. 25, 2020

Related U.S. Application Data

(60) Provisional application No. 62/548,584, filed on Aug. 22, 2017.

(51) Int. Cl.
*H05K 13/00* (2006.01)
*H05K 1/02* (2006.01)
*H05K 13/04* (2006.01)

(52) U.S. Cl.
CPC ....... *H05K 13/0061* (2013.01); *H05K 1/0269* (2013.01); *H05K 13/0015* (2013.01);
(Continued)

(58) Field of Classification Search
CPC .......... H05K 13/0015; H05K 13/0061; H05K 13/0069; H05K 13/0404; H05K 13/0406;
(Continued)

(56) References Cited

U.S. PATENT DOCUMENTS

| 4,718,533 A | 1/1988 | Nussbaumer et al. |
| 4,725,182 A | 2/1988 | Sakamoto et al. |

(Continued)

FOREIGN PATENT DOCUMENTS

| EP | 2373144 A1 | 10/2011 |
| JP | 9-86660 A | 3/1997 |

(Continued)

OTHER PUBLICATIONS

Machine translation of description section of JP 2001-185898 acquired from EPO website (Espacenet.com) (Year: 2021).*

(Continued)

*Primary Examiner* — Peter Dungba Vo
*Assistant Examiner* — Joshua D Anderson
(74) *Attorney, Agent, or Firm* — Schmeiser, Olsen & Watts, LLP

(57) ABSTRACT

An assembly machine comprising a continuous circuitous track; a dispensing head system configured to at least partially assemble products, wherein the dispensing head system includes one or more dispensing heads movable around the continuous circuitous track; a product conveyance system extending between a first location of the continuous circuitous track and a second location of the continuous circuitous track and a placement module, the placement module including a first positioning system configured to move along a first axis that intersects with the product conveyance system, wherein the first positioning system is configured to receive a first of the products from the product conveyance system and move the first of the (Continued)

products from the product conveyance system to a first placement location; and a second positioning system configured to move along a second axis that intersects with the product conveyance system, wherein the second positioning system is configured to receive a second of the products from the product conveyance system and move the second of the products from the product conveyance system to a second placement location.

13 Claims, 38 Drawing Sheets

(52) U.S. Cl.
CPC .... *H05K 13/0495* (2013.01); *Y10T 29/53174* (2015.01); *Y10T 29/53265* (2015.01)

(58) Field of Classification Search
CPC ........... H05K 13/0411; H05K 13/0495; H05K 13/081; H05K 13/0812; Y10T 29/4913; Y10T 29/49131; Y10T 29/5313; Y10T 29/53174; Y10T 29/53178; Y10T 29/53187; Y10T 29/53265; Y10T 29/53417
See application file for complete search history.

(56) References Cited

U.S. PATENT DOCUMENTS

| | | | |
|---|---|---|---|
| 4,850,104 A | 7/1989 | Matrone et al. | |
| 5,884,746 A | 3/1999 | Leisner et al. | |
| 6,176,007 B1 | 1/2001 | Kashiwagi et al. | |
| 6,189,702 B1 | 2/2001 | Bonnet | |
| 6,643,917 B1* | 11/2003 | Gieskes | H05K 13/0061 |
| | | | 29/740 |
| 6,725,532 B1* | 4/2004 | Okada | H05K 13/0411 |
| | | | 414/222.01 |
| 7,032,304 B2 | 4/2006 | Gieskes | |
| 7,036,213 B2* | 5/2006 | Kabeshita | H05K 13/085 |
| | | | 29/740 |
| 7,200,922 B2 | 4/2007 | Kabeshita et al. | |
| 8,096,408 B2 | 1/2012 | Deyanov | |
| 8,651,262 B2 | 2/2014 | Kondo | |
| 8,789,265 B2 | 7/2014 | Yagi et al. | |
| 8,925,187 B2 | 1/2015 | Shimizu et al. | |
| 9,078,385 B2* | 7/2015 | Kido | H05K 13/0061 |
| 9,345,147 B2 | 5/2016 | Doyle | |
| 2003/0226251 A1* | 12/2003 | Mehdianpour | H05K 13/0069 |
| | | | 29/739 |
| 2004/0148767 A1* | 8/2004 | Mehdianpour | H05K 13/085 |
| | | | 29/832 |
| 2008/0184557 A1* | 8/2008 | Park | H05K 13/085 |
| | | | 29/840 |
| 2013/0145597 A1 | 6/2013 | Kodama et al. | |
| 2015/0173260 A1 | 6/2015 | Gieskes et al. | |
| 2015/0181720 A1 | 6/2015 | Gieskes et al. | |
| 2015/0181779 A1 | 6/2015 | Gieskes et al. | |
| 2017/0034967 A1 | 2/2017 | Kido | |

FOREIGN PATENT DOCUMENTS

| | | |
|---|---|---|
| JP | 2001185898 A * | 7/2001 |
| WO | 2019040629 A1 | 2/2019 |

OTHER PUBLICATIONS

International Patent Application No. PCT/US2018/047538, International Search Report and the Written Opinion of the International Searching Authority, or the Declaration dated Oct. 22, 2018, 23 pages.

* cited by examiner

PRINTED CIRCUIT BOARD TRANSPORT

RELATED APPLICATIONS

This application claims priority to International Patent Application No. PCT/US2018/047538, filed Aug. 22, 2018, entitled "Improved Printed Circuit Board Transport," which claims priority to U.S. Provisional Application No. 62/548,584 filed Aug. 22, 2017 entitled "Improved Printed Circuit Board Transport," the disclosures of which is hereby incorporated by reference to the extent that they are not inconsistent with the present disclosure.

TECHNICAL FIELD

Printed circuit boards and more specifically, the transport of printed circuit boards in an automated electronics assembly system.

BACKGROUND

In a state of the art electronic assembly systems, the printed circuit board (PCB) is typically transported on a belt conveyor system which supports two side edges of the PCB. The conveyor system is often configured in multiple inline sections to enable buffering PCBs in close proximity to the assembly space of the machine to minimize the PCB transfer time. In high volume production systems for PCBs with fewer components to be assembled on the PCB, the assembly time for each assembly system in a line becomes so short that the PCB transfer time becomes a significant part of the total takt time of the line. The term "takt time" may refer to the time measured from the moment a first component is assembled on a first PCB to the moment a first component assembled on a second PCB. When a high-volume line is required to produce PCBs with few components, state of the art assembly systems often add a second belt conveyor system in parallel to the first system. There may also be many components spread over many machines such that each machine has few components.

A second conveyor belt may allow for transferring a second PCB into the assembly space of the assembly system while a first PCB is being assembled, thus eliminating the transfer time completely. However, the second belt conveyor does not eliminate nor reduce the PCB position acquisition time also called "fiducial time." To be able to adjust both belt conveyor systems to the width of the PCBs, each conveyor system has at least one rail that is movable to adjust the width. In some systems all four rails are movable in width to increase the flexibility to accommodate different line configuration requirements.

State of the art systems that have two positioning systems and two parallel PCB conveyors also offer the option of operating both positioning systems independently of each other and assembling two PCBs simultaneously. This is often called a "split machine capability." The split machine capability may create two parallel lines in a single inline production system, increasing the robustness and also doubling the number of components that may be placed per placement station, while less than doubling the time to place components per placement station, resulting in an overall marginal increase in throughput.

If a state of the art dual PCB conveyor system is configured to eliminate the PCB transfer time, the first PCB may be close to a first side of the machine, while a second PCB may be close to the second side of the machine. The positioning of the first PCB and second PCB changes the travel distance for the positioning system from a first PCB to a second PCB, especially if two positioning systems are active. Having two active positioning systems means that the assembly speed is negatively impacted, since the positioning system with the short travel distance is forced to wait until the positioning system with the longer travel distance has completed assembling the components collected from a greater distance. The effect of this is that such a state of the art system is running at double the speed of the slowest positioning system, negating of the gained output by eliminating the PCB transfer time.

Another disadvantage of the state of the art systems is that the systems do not eliminate the time to acquire the transferred PCB's position with respect to the machine calibrated assembly space. This is achieved by moving a camera over specific spots on the PCB that offer fiducials or marks on the PCB. In case of multi panel PCBs this time can be significant, since several fiducials per sub panel may have to be imaged by the camera and processed by a vision system. A vision system may comprise a camera. For example, a camera of a vision system may be configured to view products being assembled from above the products. As another example, a camera of a vision system may be configured to view components before assembly. Often there may also be bad board marks applied to multi panel PCBs. These are ink or paint marks to indicate that certain sub panels need not be assembled since a defect on the panel was identified earlier in the assembly process.

A third disadvantage of state of the art systems is related to achieving parallel production with two parallel PCB conveyor systems. If the split machine mode is activated to achieve this the benefit of eliminating the PCB transfer time from the total PCB handling time is not realized.

A fourth disadvantage of state of the art systems is related to achieving parallel production with more robustness than can be achieved in a split machine configuration, i.e. with three or more systems in parallel while the systems are physically arranged in series in the production line. In such systems elaborate PCB handling systems such as PCB conveyors, elevators, diverters and buffers are located outside, under or over the machines to create the capability for the PCBs to bypass around, under or over the machines.

Accordingly, a need exists in the art for an assembly machine and method that eliminates time lost between the last placement of an electronic component on a first printed circuit board or substrate and the first electronic component placed on a second PCB. This lost time or PCB handling time may consist of two parts: firstly the PCB transfer time to move a first PCB out of the assembly space and move a second PCB into the assembly space; and secondly, PCB position acquisition time also called fiducial time, i.e. the time to acquire the position of the second PCB with respect to the calibrated space of the assembly system, such that the electronic components can be placed accurately on the corresponding contact pads on the PCB. Likewise, a need exists in the art for an assembly machine and method that allows multiple assembly systems, which are physically arranged in series in a single production line, to be operated in parallel to one another, such that each assembly system is able to place all the electronic components on each PCB and also to create a system that is more robust in case of interrupts that may occur in any one of the individual assembly systems. An interrupt in a single assembly system operating in series with other assembly systems stops the entire output of the production line. Conversely, an interrupt in a setup with multiple assembly systems in a parallel configuration would only stop the output of the one unit experiencing the interruption.

SUMMARY

According to a first aspect, an assembly machine comprises a continuous circuitous track; a dispensing head system configured to at least partially assemble products, wherein the dispensing head system includes one or more dispensing heads movable around the continuous circuitous track; a product conveyance system extending between a first location of the continuous circuitous track and a second location of the continuous circuitous track and a placement module, the placement module including: a first positioning system configured to move along a first axis that intersects with the product conveyance system, wherein the first positioning system is configured to receive a first of the products from the product conveyance system and move the first of the products from the product conveyance system to a first placement location; and a second positioning system configured to move along a second axis that intersects with the product conveyance system, wherein the second positioning system is configured to receive a second of the products from the product conveyance system and move the second of the products from the product conveyance system to a second placement location.

According to a second aspect, a placement module comprises: a first positioning system configured to move along a first axis, wherein the first positioning system is configured to receive a first product from a product conveyance system and move the first product from the product conveyance system to a first placement location; and a second positioning system configured to move along a second axis, wherein the second positioning system is configured to receive a second product from the product conveyance system and move the second product from the product conveyance system to a second placement location.

According to a third aspect, a method of assembly comprises: providing an assembly machine including: a continuous circuitous track; a dispensing head system, wherein the dispensing head system includes one or more dispensing heads movable around the continuous circuitous track; a product conveyance system extending between a first location of the continuous circuitous track and a second location of the continuous circuitous track; and a placement module, the placement module including a first positioning system; and a second positioning system; moving, by the first positioning system, along a first axis that intersects with the product conveyance system; receiving, by the first positioning system, a first product from the product conveyance system; moving, by the first positioning system, the first product from the product conveyance system to a first placement location; moving, by the second positioning system, along a second axis that intersects with the product conveyance system; receiving, by the second positioning system, a second product from the product conveyance system; moving, by the second positioning system, the second product from the product conveyance system to a second placement location; and at least partially assembling, by the dispensing head system, the first product and the second product.

BRIEF DESCRIPTION OF THE DRAWINGS

Some of the embodiments will be described in detail with references made to the following figures, wherein like designations denote like members, wherein.

DETAILED DESCRIPTION

A detailed description of the hereinafter-described embodiments of the disclosed apparatus and method are presented herein by way of exemplification and not limitation with reference made to the Figures. Although certain embodiments are shown and described in detail, it should be understood that various changes and modifications might be made without departing from the scope of the appended claims. The scope of the present disclosure will in no way be limited to the number of constituting components, the materials thereof, the shapes thereof, colors thereof, the relative arrangement thereof, etc., and are disclosed simply as an example of embodiments of the present disclosure. A more complete understanding of the present embodiments and advantages thereof may be acquired by referring to the following description taken in conjunction with the accompanying drawings, in which like reference numbers indicate like features.

As a preface to the detailed description, it should be noted that, as used in this specification and the appended claims, the singular forms "a", "an" and "the" include plural referents, unless the context clearly dictates otherwise.

Figure 1A:
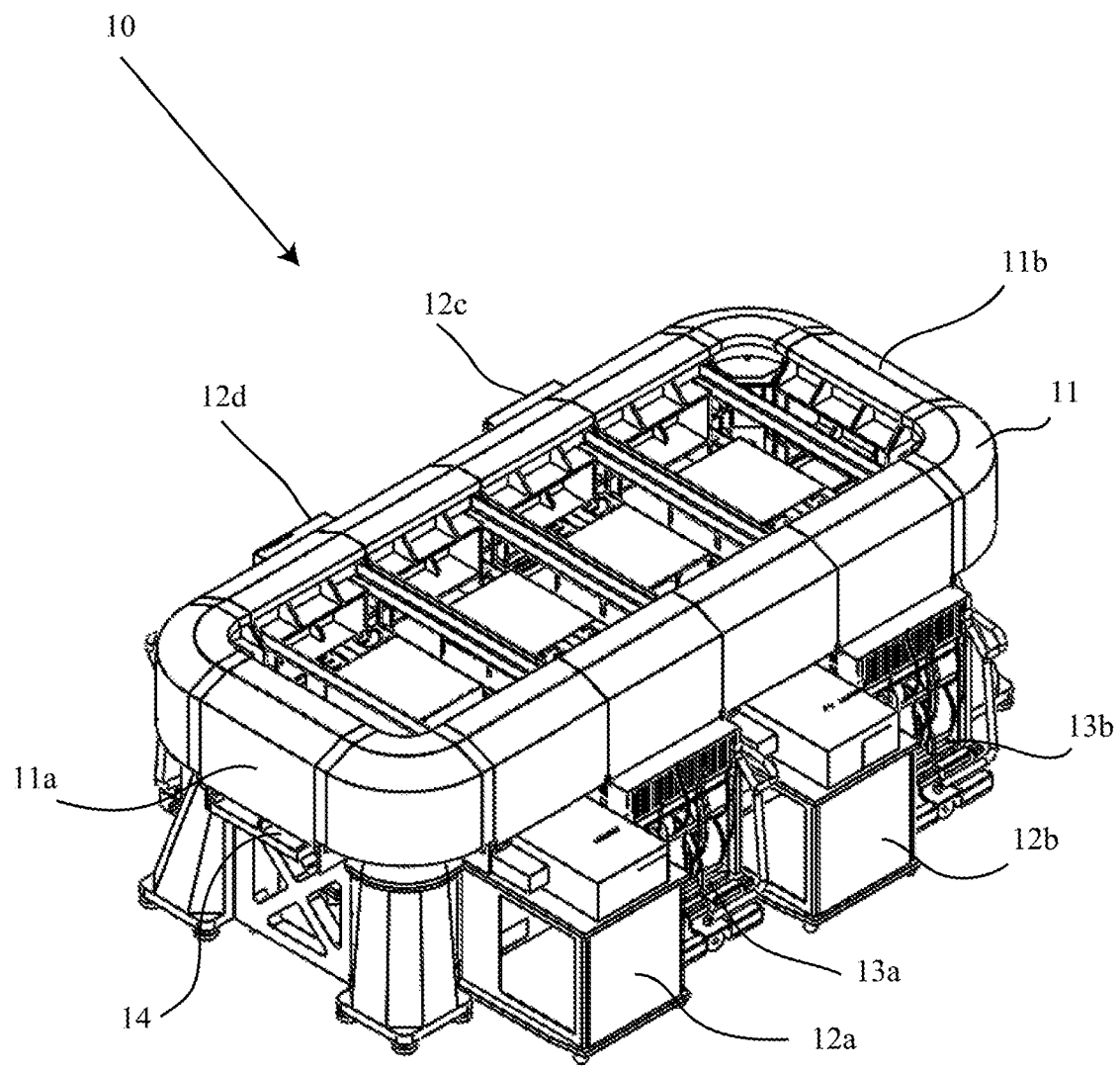
FIG. 1A depicts a system level view of an automated electronics assembly system.

Referring to FIG. 1A, a system level view of an assembly machine 10 according to one embodiment is shown. The assembly machine 10 may be an automated electronics assembly system. The assembly machine 10 may be a flexible sequencer architecture (FSA) machine. The assembly machine 10 may be an FSA system. The assembly machine 10 may be a pick and place machine configured to configured to assemble a product such as a circuit board such as a printed circuit board (PCB). However, the disclosure may be applicable to other types of assembly machines such as toy assembly, tool assembly, appliance assembly, welding, adhesive applying, or the like. The assembly machine 10 may be configured to assemble any device, apparatus or unfinished product that needs component parts to be placed at predetermined locations or other finishing work applied. Herein "product" may refer to products which are unfinished at the time that they enter the assembly machine 10. However, it should be understood that "products" may become finished by the assembly machines 10. Alternately, the "product" may never become fully finished by the assembly machine 10, as they may require further assembly steps (not shown).

The assembly machine 10 includes four placement modules 12a, 12b, 12c, and 12d, four feeder modules 13a, 13b, 13c (not shown) and 13d (not shown). The assembly machine 10 includes a dispensing head system (not shown) that includes one or more dispensing heads. For example, the dispensing head system may include pick and place heads for picking up and placing component parts on products such as PCBs 40a, 40b, 40c, 40d. The dispensing heads may also have other functions such as inspection, dispensing of adhesive, or welding tools. Alternately, the dispensing heads may be configured to pick up any other types of components for tools, toys, appliances or the like. The dispensing head system may be modular, and each of the dispensing heads may be modular. Each dispensing head may be a pick and place head that is configured to pass over feeder modules 13a, 13b, 13c, 13d before arriving at a PCB 40a, 40b, 40c, 40d being moved in a placement module.

Likewise, the feeder modules 13a, 13b, 13c, 13d may be modular. The feeder modules 13a, 13b, 13c, 13d may feed circuit board components or other products. The feeder modules 13a, 13b, 13c, 13d may be tape feeders, tray feeders, or other means of presenting components to be picked up by dispensing heads traveling on the track 11. The feeder modules 13a, 13b, 13c, 13d may each be different. Each feeder module 13a, 13b, 13c, 13d may include a plurality of feeders aligned adjacent to each other. Many other types of feeder modules are contemplated however, for feeding various other types of component parts to dispensing heads. The feeder modules 13a, 13b, 13c, 13d may also provide adhesive, or welding materials to the dispensing heads, or may function as processing stations to test, trim, or prepare components. The placement modules 12a, 12b, 12c, 12d, may accept PCBs 40a, 40b, 40c, 40d, 40e or any other products, or partially assembled products, for assembly.

The assembly machine 10 includes a track 11 that comprises a continuous loop, circuit, ring, circle or the like. The track 11 may be a continuous circuitous track. The track 11 may comprise one or more modular track components including straight track modular components and curved track modular components. The track 11 may extend around the perimeter of the assembly machine 10. The track 11 may define a perimeter of the assembly machine 10. The track 11 may be configured to pass over component feeding mechanisms such as feeder modules 13a, 13b, 13c, 13d. It may be advantageous for the track 11 to pass over each feeder module 13a, 13b, 13c, 13d in order for each pick and place head of the dispensing head system to be able to carry the most optimal components for placement onto a PCB 40a, 40b, 40c, 40d with minimal movement of the PCB 40a, 40b, 40c, 40d between placements. Use of a continuous circuitous track 11 system may allow pick and placement of components without a difference in the time needed to collect the components from the feeder modules 13a, 13b, 13c, 13d.

The track 11 may be continuous and circuitous such that the dispensing heads are configured to rotate about the track 11 in a single direction. For example, all of the dispensing heads may rotate about the track 11 in a clockwise direction. Alternately, the dispensing heads may rotate about the track 11 in a counterclockwise direction. The dispensing heads may be configured to pick up components stored in the feeder modules 13a, 13b, 13c, 13d as they pass by along the track 11. The dispensing heads may thereafter be configured to place the components on a product 40a, 40b, 40c, 40d, 40e that is located in the first placement module 12a, the second placement module 12b, the third placement module 12c, or the fourth placement module 12d. As an example, the dispensing heads may populate PCBs as the dispensing heads move along the track 11. After placement, the dispensing heads may continue to rotate about the track to pick up more components from the feeder modules 13a, 13b, 13c, 13d and place them on the product 40a, 40b, 40c, 40d, 40e located in the placement modules 12a, 12b, 12c, 12d.

The assembly machine 10 includes a product conveyance system 14 that extends between a first location 11a of the track 11 and second location 11b of the track 11. The product conveyance system 14 may be a belt conveyor system. The product conveyance system 14 may extend between the placement modules 12a, 12b, 12c, 12d and feeder modules 13a, 13b, 13c, 13d of the assembly machine 10. For example, the product conveyance system 14 may comprise a plurality of product conveyance sections configured to be positioned in between the placement modules 12a, 12b, 12c, 12d and feeder modules 13a, 13b, 13c, 13d of the assembly machine 10. The product conveyance system 14 may be referred to as an upline input conveyor. The product conveyance system 14 may include an input PCB belt conveyor system. The product conveyance system 14 may extend under the continuous circuitous track 11 between the first location 11a and second location 11b. The product conveyance system 14 is not limited to extending between the first location 11a and the second location 11b, and could extend between any locations on the continuous circuitous track 11. The product conveyance system 14 may convey one or more PCBs 40a, 40b, 40c, 40d from outside the assembly machine 10 by passing one or more PCBs 40a, 40b, 40c, 40d underneath a track 11 to the inside of the assembly machine 10. The product conveyance system 14 may operate in a manner such that the product conveyance system 14 may deliver each PCB 40a, 40b, 40c, 40d to the placement modules 12a, 12b, 12c, 12d. The product conveyance system 14 may carry PCBs 40a, 40b, 40c, 40d from one or more processing stations that precede the assembly machine 10 such as a screen printer and optical inspection systems. The product conveyance system 14 may comprise a downline conveyor system configured to remove PCBs 40a, 40b, 40c, 40d from a placement module 12a, 12b, 12c, 12d. The product conveyance system 14 may be configured to remove PCBs 40a, 40b, 40c, 40d from a placement module 12a, 12b, 12c, 12d. PCBs 40a, 40b, 40c, 40d removed from a placement module may be conveyed to another placement module 12a, 12b, 12c, 12d of the assembly machine 10, or may be conveyed, for example, by the product conveyance system 14 to pass under the track 11 to an output side of the assembly machine 10, allowing for PCBs 40a, 40b, 40c, 40d to pass to a next processing station in a PCB assembly line, such as an optical inspection machine, or a reflow oven.

Figure 1B:
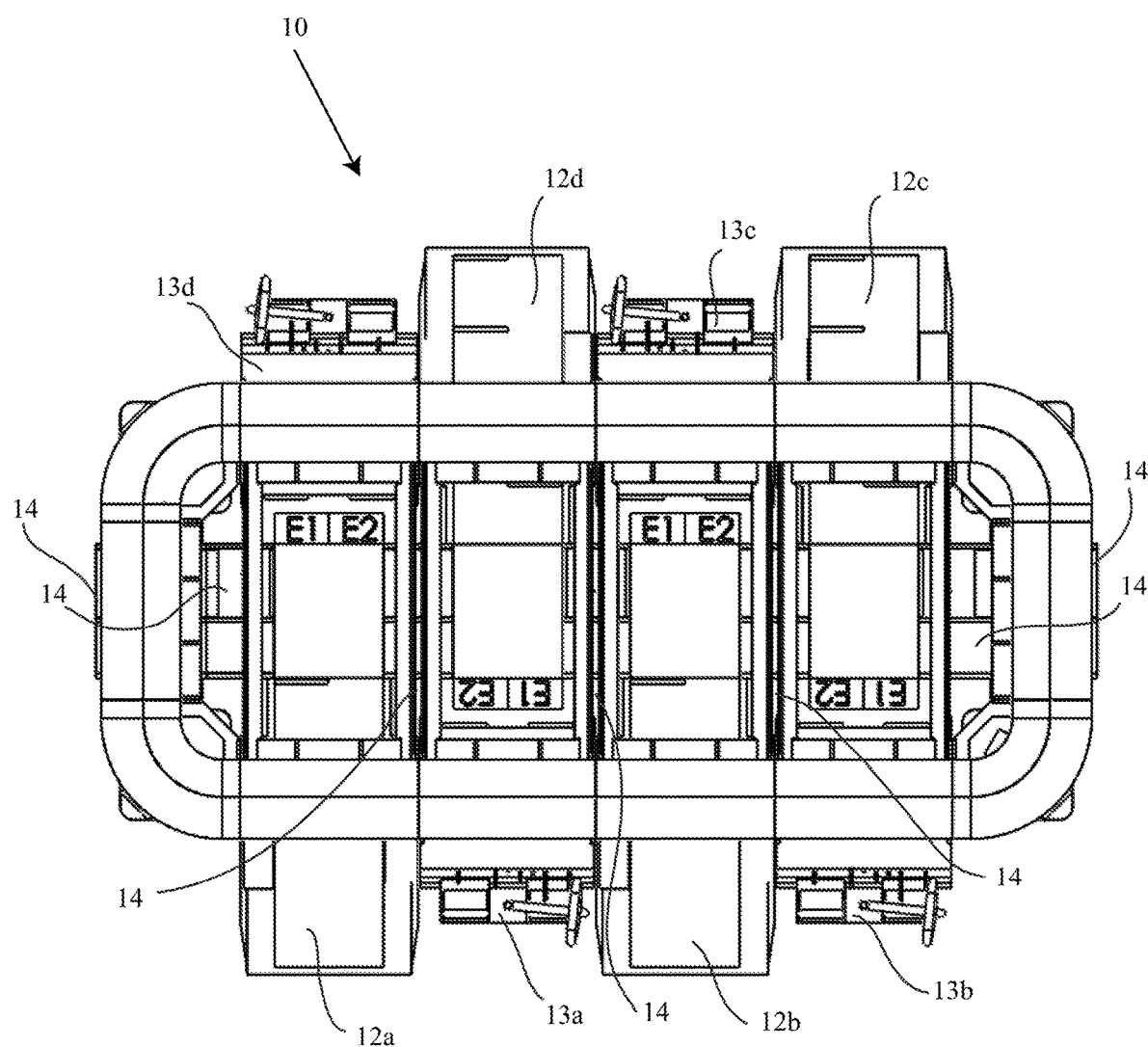
FIG. 1B depicts a top view of the automated electronics assembly system of FIG. 1A.

The FSA structure facilitated by the modularity of the components of the assembly machine 10 permits a user to mechanically arrange the configuration of the assembly machine 10 according to a user's requirements. For example, the placement modules 12a, 12b, 12c, 12d may be slid underneath the track 11 in a desired configuration. Likewise, the feeder modules 13a, 13b, 13c, 13d, may be slid underneath the track 11 in a desired configuration. As shown in FIGS. 1A and 1B, the feeder modules 13a, 13b, 13c, 13d and placement modules 12a, 12b, 12c, 12d may be arranged in an alternating pattern, and the feeder modules 13a, 13b, 13c, 13d may be placed adjacent to the placement modules 12a, 12b, 12c, 12d. For example, the placement modules 12a, 12b, 12c, 12d may be arranged around the track 11. For example, as shown in FIGS. 1A and 1B, the placement modules 12a, 12b, 12c, 12d may be placed around the track 11 in alternating order with the feeder modules 13a, 13b, 13c, 13d, though the placement modules 12a, 12b, 12c, 12d are not limited to this configuration. The placement modules 12a, 12b, 12c, 12d may intersect with the product conveyance system 14 such that the placement modules 12a, 12b, 12c, 12d are configured to receive products 40a, 40b, 40c, 40d, 40e from the product conveyance system 14. The placement modules 12a, 12b, 12c, 12d may be configured to provide products 40a, 40b, 40c, 40d, 40e to the product conveyance system 14, to another placement module 12a, 12b, 12c, 12d, to another feeder 13a, 13b, 13c, 13d, or other down-line component or process.

As another example, each of the placement modules 12a, 12b, 12c, 12d, each of the feeder modules 13a, 13b, 13c, 13d, the track 11, and the dispensing head system may each be modular and mechanically attachable such that the assembly machine is reconfigurable to any size or capacity. For example, additional feeder modules or placement modules may be added to the assembly machine 10 and additional modular track components may be added to the assembly machine 10 to accommodate the additional feeder modules or placement modules. As another example, the assembly machine 10 may have less than four placement modules 12a, 12b, 12c, 12d or less than four feeder modules 13a, 13b, 13c, 13d. For example, a user may remove placement modules 12a and 12d, and remove feeder modules 13a and 13d to reduce the size of the assembly machine 10. In this instance, the user may remove one or more modular track components such that the track 11 aligns with the smaller size of the assembly machine 10. It should be further understood that the assembly machine 10 is not limited to having a track 11 that is continuous circuitous, and may have a track with a linear configuration or other configuration.

Figure 2:
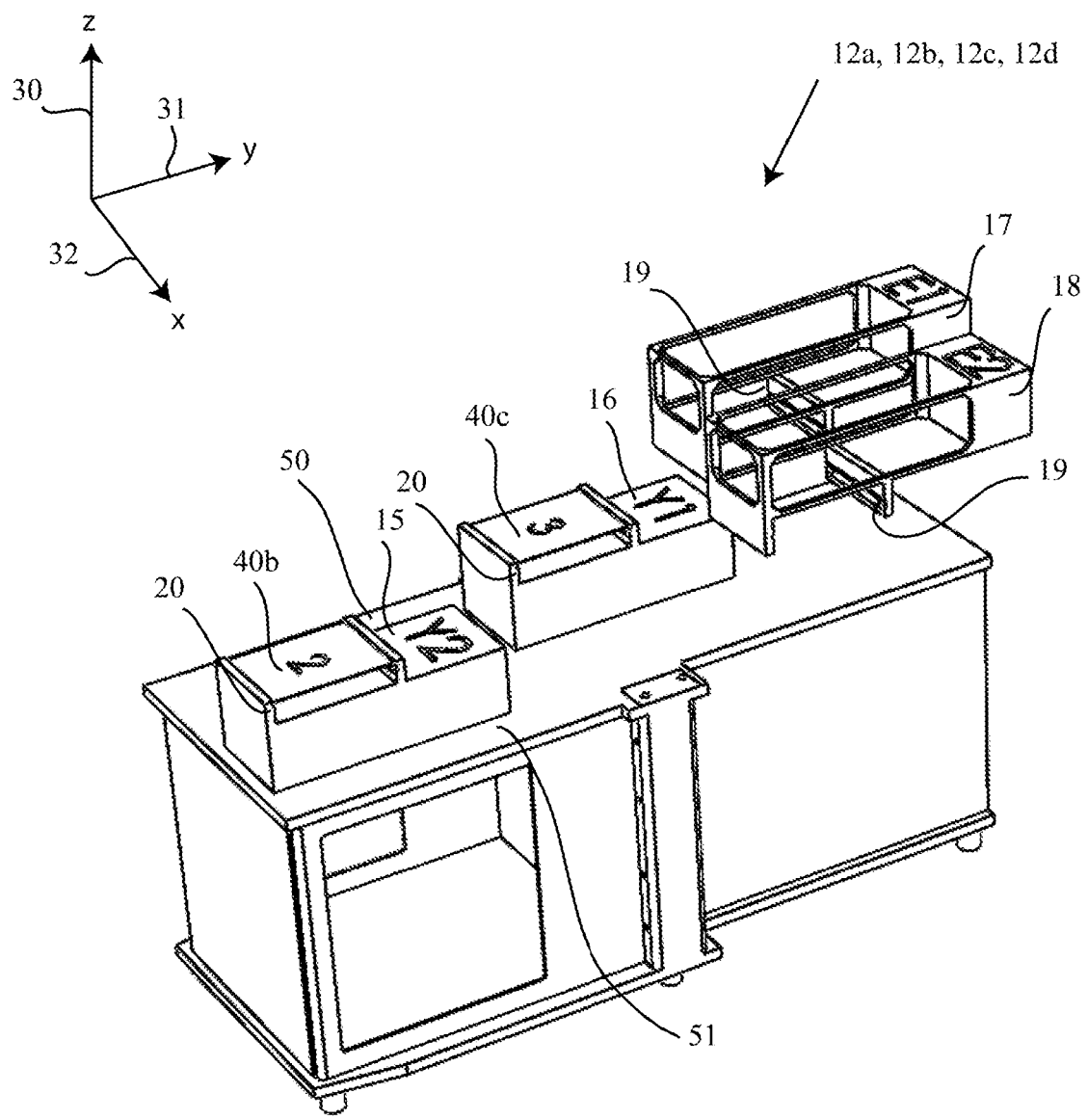
FIG. 2 depicts an embodiment of a placement module of an automated electronics assembly system.

Referring now to FIG. 2, a perspective view of an embodiment of a placement module 12a, 12b, 12c, 12d is shown. The placement module 12a, 12b, 12c, 12d has a first positioning system 15 and a second positioning system 16. The first positioning system 15 and the second positioning system 16 may each be a servo positioning system. The first positioning system 15 and the second positioning system 16 may each comprise a servo positioning system. The first positioning system 15 and the second positioning system may each be mounted to one or more servo positioning systems.

The direction along which the first positioning system 15 moves may extend on a "Y-axis" 31 and be referred to as a first axis. The direction along which the second positioning system 16 moves may also extend on a "Y-axis" 31 and be referred to as a second axis. The first axis may be parallel to the second axis.

The product conveyance system 14 may extend along an "X-axis" 32 that is referred to as a third axis. The third axis may be perpendicular to the first axis and the second axis. The first axis and the second axis may intersect with the product conveyance system 14 such that the first positioning system 15 and the second positioning system 16 are configured to receive products 40a, 40b, 40c, 40d from the product conveyance system 14. By having the first positioning system 15 and the second positioning system 16 move along the first axis and the second axis, each dispensing head, such as pick and place head, of the dispensing head system may have access to one or more entire PCB 40a, 40b, 40c, 40d for placement of components. Moreover, in some embodiments, each pick and place head may also have access to the position of one or more PCBs 40a, 40b, 40c, 40d with respect to a calibrated space of the system using a vision system such as a camera mounted system on each pick and place head. A camera mounted system positioned on the pick and place head may be enabled to find fiducials or marks on the PCB. As another example, a stationary vision system comprising a camera may be mounted on the placement module 12a, 12b, 12c, 12d to image components being carried by the dispensing heads of the dispensing head system.

The first positioning system 15 and the second positioning system 16 may be configured to receive products 40a, 40b, 40c, 40d from the product conveyance system 14 and provide products 40a, 40b, 40c, 40d to the product conveyance system 14. The first positioning system 15 may have a belt conveyor such as an edge belt conveyor 20 and the second positioning system 16 may have a belt conveyor such as an edge belt conveyor 20. The product conveyance system 14 may be configured in line with the edge belt conveyors 20 of the first positioning system 15 and the second positioning system 16. For example, the edge belt conveyors 20 may be parallel to the product conveyance system 14 when the first positioning system 15 moves along the first axis such that the first positioning system intersects with the product conveyance system 14, and when the second positioning system 16 moves along the second axis such that the second positioning system 16 intersects with the product conveyance system 14. The edge belt conveyors 20 may include edge clamps, and may include board support features that permit the edge belt conveyors 20 to rigidly fix products 40a, 40b, 40c, 40d such as PCBs, to the first positioning system 15 and the second positioning system 16 during assembly of the products 40b, 40c. The clamps may permit a PCB 40a, 40b, 40c, 40d to be clamped by the PCB's 40a, 40b, 40c, 40d edges in one or more locations of the track 11.

The first positioning system 15 may receive products 40a, 40b, 40c, 40d from the product conveyance system 14 by the products 40a, 40b, 40c, 40d moving from the product conveyance system 14 into the edge belt conveyor 20 of the first positioning system 15. The second positioning system 16 may receive products 40a, 40b, 40c, 40d from the product conveyance system 14 by the products 40a, 40b, 40c, 40d moving from the product conveyance system into the edge belt conveyor 20 of the second positioning system 16. The edge belt conveyors 20 may receive and provide products 40a, 40b, 40c, 40d along the third axis and perpendicular to the first axis and the second axis. In other words, the edge belt conveyors 20 may receive and provide products 40a, 40b, 40c, 40d along the X-axis 32, perpendicular to the Y-axis 31.

The first positioning system 15 may be configured to move products 40a, 40b, 40c, 40d along the first axis to a first placement location 50 where the dispensing head system can assemble the products 40a, 40b, 40c, 40d for example, by populating PCBs with components. One or more fiducial markers of products 40a, 40b, 40c, 40d may be positioned within the first placement location 50, for example, by one or more vision systems such as one or more cameras. The second positioning system 16 may be configured to move products 40a, 40b, 40c, 40d along the second axis to a second placement location 51 where the dispensing head system can assemble the products 40a, 40b, 40c, 40d, for example, by populating PCBs with components. One or more fiducial markers of products 40a, 40b, 40c, 40d may be located within the second placement location 51, for example, by one or more vision systems such as one or more cameras. For example, the dispensing heads of the dispensing head system may image fiducials of a product 40a, 40b, 40c, 40d on the second positioning system 16 while the dispensing heads are populating a second product 40a, 40b, 40c, 40d, such that when the dispensing heads are done populating the first product 40a, 40b, 40c, 40d, the dispensing heads can immediately begin populating the second product 40a, 40b, 40c, 40d because the fiducials of the second product 40a, 40b, 40c, 40d have already been imaged. The dispensing head system may be configured such that the dispensing heads move along the X-axis 32, perpendicular to the to the first axis of the first positioning system 15 and the second axis of the second positioning system. The first placement location 50 and the second placement location 51 may define an assembly space of the assembly machine 10. The second positioning system 16 may be configured to move a second product 40a, 40b, 40c, 40d from the product conveyance system 14 to a second placement location 51 while a first product 40a, 40b, 40c, 40d, 40e is being at least partially assembled on the first positioning system 16 by the dispensing head system.

While carrying components to be assembled on a first PCB 40a, 40b, 40c, 40d, dispensing heads of the dispensing head system, such as pick and place heads, may simultaneously pass over a second PCB 40a, 40b, 40c, 40d positioned into the assembly space by the second positioning system 16 allowing a fiducial camera system mounted on each of the pick and place heads to determine the position of the second PCB 40a, 40b, 40c, 40d in the calibrated space of the FSA system. The second PCB 40a, 40b, 40c, 40d may now be completely ready for assembly and the time between the last placement on the first PCB 40a, 40b, 40c, 40d and the first placement, for example, of a component, on the second PCB 40a, 40b, 40c, 40d can be as short as the time between two regular consecutive placements on a single PCB 40a, 40b, 40c, 40d, thereby eliminating all lost assembly time between a first and a second PCB 40a, 40b, 40c, 40d. The complete elimination of the PCB handling time between the last placement of a component on a first PCB and the first placement of a component on a second PCB may be particularly advantageous in combination with the dispensing head system configured to acquire fiducial positions of a second PCB while the dispensing head system is simultaneously placing components on a first PCB in the same assembly space.

The first positioning system 15 may be configured to move independently of the second positioning system 16. The first positioning system 15 and the second positioning system 16 may also be configured to move in tandem, which may permit a larger PCB 40e, for example, a PCB 40e that is longer than 50 percent of a placement module's 12a, 12b, 12c, 12d width may be transferred and held by the first positioning system 15 and the second positioning system 16 at the same time. For example, the first positioning system 15 and the second positioning system 16 may be configured to collectively receive a larger product 40e from the product conveyance system 14 such that the product 40e extends across the first positioning system 15 and the second positioning system 16, and the first positioning system 15 and the second positioning system 16 may be configured to move simultaneously along the first axis and second axis and maintain an adjacent relationship after receiving the product 40e. The simultaneous movement of the first positioning system 15 and the second positioning system 16 may be accomplished by one or more software modes or by one or more mechanical features that may activate to couple the first positioning system 15 and the second positioning system 16, such as by coupling both Y-axis servos, in order to move the first positioning system 15 and the second positioning system 16 as a single unit. This may be referred to as a "dual placement mode" of the placement module 12a, 12b, 12c, 12d. The dual placement mode may be advantageous for assembling larger products 40e, such as larger PCBs that have a width greater than the width of the first positioning system 15 or the second positioning system 16. In using the dual placement mode, the maximum size of a PCB 40a, 40b, 40c, 40d, 40e that can be accommodated by the placement module 12a, 12b, 12c, 12d is increased.

The placement module 12a, 12b, 12c, 12d may also include a first vertically movable conveyor 17 and a second vertically movable conveyor 18. For example, the first movable conveyor 17 may be a first elevator conveyance system 17, and the second vertically movable conveyor may be a second elevator conveyance system 18. The first elevator conveyance system 17 may be configured to move vertically along a "Z-axis" 30. The axis of movement of the first elevator conveyance system may be referred to as fourth axis. The first elevator conveyance system 17 may be configured to receive products 40a, 40b, 40c, 40d from the product conveyance system 14. The second elevator conveyance system 18 may be configured to move vertically along the Z-axis in an axis of movement called fifth axis, and may be configured to receive products 40a, 40b, 40c, 40d from the first positioning system 15 or the first elevator conveyance system 17. The first elevator conveyance system 17 may be configured to move products 40a, 40b, 40c, 40d to the second elevator conveyance system 18. The first elevator conveyance system 17 may include an edge belt conveyor 19 and the second elevator conveyance system 18 may include an edge belt conveyor 19. The edge belt conveyors 19 may be configured to receive products 40a, 40b, 40c, 40d, and move products 40a, 40b, 40c, 40d along the X-axis 32, for example, perpendicular to the first axis of the first positioning system 15 and the second axis of the second positioning system 16. Embodiments of the assembly machine 10 may include a plurality of edge belt conveyors 19, 20 capable of receiving PCBs 40a, 40b, 40c, 40d conveyed by the product conveyance system 14. In another embodiment, a single horizontally movable PCB conveyor of same length as a conveyor mounted on the Y-axis servo positioning system such as the first positioning system 15 or the second positioning system 16 can be used to move horizontally in the X-axis between an input PCB conveyor such as the product conveyance system 14 and an output PCB conveyor, such as the product conveyance system 14. This belt conveyor, positioned in a first position, may transfer PCBs 40a, 40b, 40c, 40d from the first conveyor mounted on the first Y-axis servo positioning system 15 to the output PCB conveyor 14 and may transfer PCBs 40a, 40b, 40c, 40d from the input PCB conveyor 14 into the second conveyor mounted on the second Y-axis servo positioning system 16, when positioned in a second position. The horizontally movable PCB conveyor may also transfer a PCB from the input PCB conveyor 14 to the output PCB conveyor 14, when both conveyors mounted on the Y-axis servo positioning systems 15, 16 are in the placement space of the placement module 12a, 12b, 12c, 12d, thus enabling parallel placement modules 12a, 12b, 12c, 12d that are physically arranged in series.

In another embodiment, two horizontally movable Y-axis movable PCB conveyor systems may be used instead of the first elevator conveyance system 17 and the second elevator conveyance system 18. The two horizontally movable Y-axis movable PCB conveyor systems may move in the opposite direction of the first positioning system 15 and the second positioning system 16. In this embodiment, a placement module 12a, 12b, 12c, 12d may need to be larger to accommodate the horizontal movement of the two horizontally movable Y-axis movable PCB conveyor systems.

The fourth axis and the fifth axis may extend along direction 30. The first elevator conveyance system 17 may be configured to receive at least one of the products 40a, 40b, 40c, 40d from the product conveyance system 14 and move the product to the second positioning system 16. The second elevator conveyance system 18 may be configured to receive at least one of the products 40a, 40b, 40c, 40d from the first positioning system.

Figure 3:
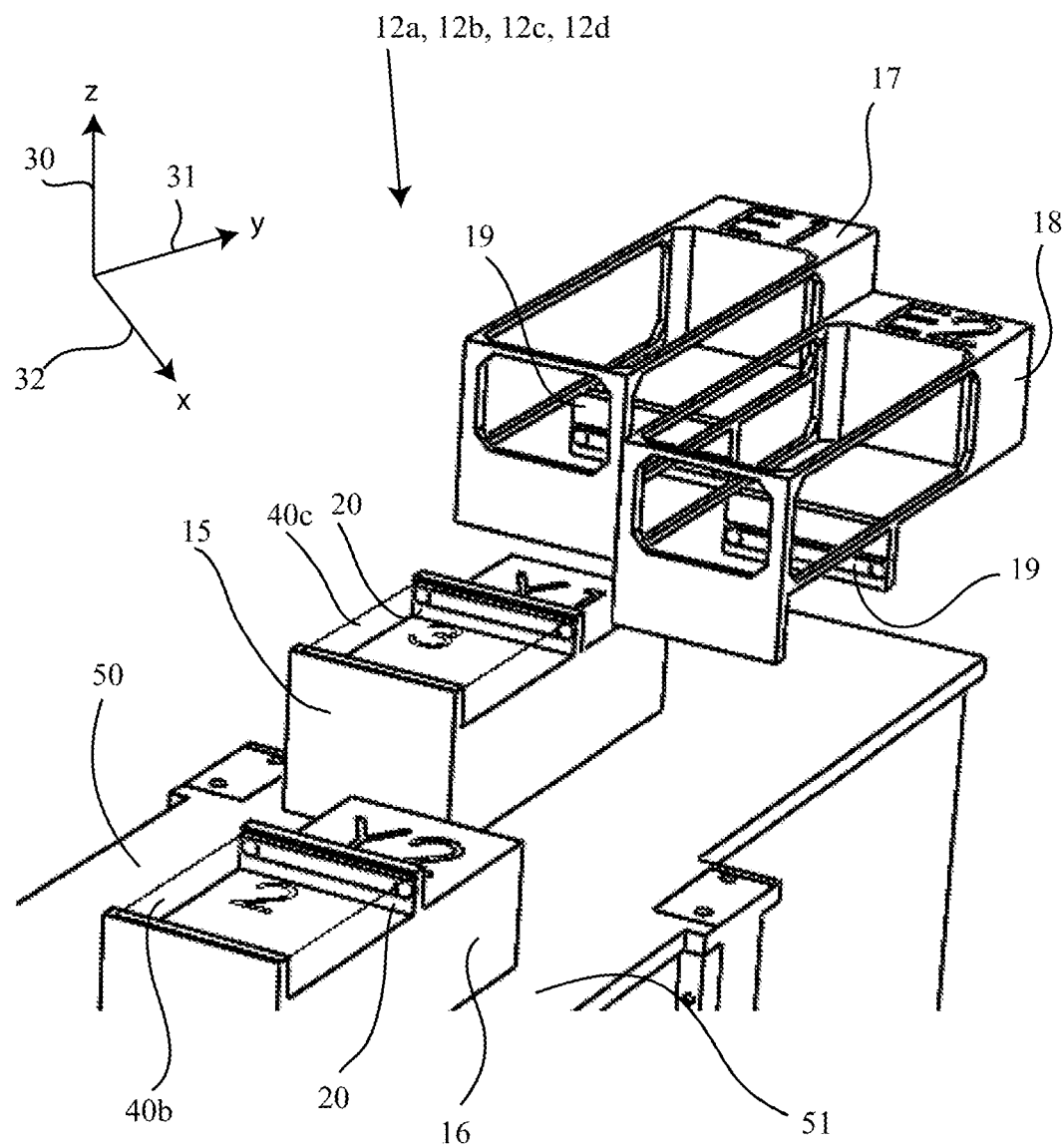
FIG. 3 depicts an alternative view of the placement module of an automated electronics assembly system.

The first elevator conveyance system 17 and the second elevator conveyance system 18 may be configured to receive products 40a, 40b, 40c, 40d and move the products 40a, 40b, 40c, 40d across the placement module 12a, 12b, 12c, 12d and directly provide the products 40a, 40b, 40c, 40d to the product conveyance system 14 without the products 40a, 40b, 40c, 40d being received by the first positioning system 15 or the second positioning system. In other words, the first elevator conveyance system 17 and the second elevator conveyance system 18 may be configured to receive at least one of the products 40a, 40b, 40c, 40d and move the at least one of the products 40a, 40b, 40c, 40d such that the at least one of the products 40a, 40b, 40c, 40d bypasses the first positioning system 15 and the second positioning system 16. As an example, multiple placement modules 12a, 12b, 12c, 12d may assemble PCBs 40a, 40b, 40c, 40d, 40e in parallel with one another such that a PCB 40a, 40b, 40c, 40d, 40e may be passed from a placement module 12a, 12b, 12c, 12d to a second placement module 12a, 12b, 12c, 12d capable of populating the PCBs 40a, 40b, 40c, 40d, 40e sooner than the first placement module 12a, 12b, 12c, 12d with presently occupied positioning systems. For example, a first placement module 12a, 12b, 12c, 12d may simultaneously assemble multiple PCBs 40a, 40b, 40c, 40d, 40e, and may transfer a next PCB 40a, 40b, 40c, 40d, 40e to a parallel placement module 12a, 12b, 12c, 12d which may have one or more unoccupied Y-axis belt conveyors such as a third positioning system and a fourth positioning system. As an example, the first positioning system 15 and the second positioning system 16 may be mounted on a Y-axis servo positioning system and may not be aligned with the product conveyance system 14, both the first elevator conveyance system 17 and the second elevator conveyance system 18 may lower and transfer PCBs 40a, 40b, 40c, 40d, 40e from the product conveyance system 14 that may need to bypass a first placement module 12a, 12b, 12c, 12d of the first placement module 12a, 12b, 12c, 12d. With continuing reference to FIGS. 1A-2 and with reference to FIG. 3, the second elevator conveyance system 18 may configured to move independently of the first elevator conveyance system 17. For example, as shown in FIG. 3, the first elevator conveyance system 17 may move vertically independently of the second elevator conveyance system 18 such that the first elevator conveyance system 17 is higher than the second elevator conveyance system 18. The first elevator conveyance system 17 and the second elevator conveyance system 18 may be configured to move independently of the first positioning system 15 and the second positioning system 16.

In another embodiment, a placement module 12a, 12b, 12c, 12d may comprise a first positioning system 15 configured to move along a first axis, wherein the first positioning system 15 is configured to receive a first product 40a, 40b, 40c, 40d from the product conveyance system 14 and move the product 40a, 40b, 40c, 40d from the product conveyance system 14 to a first placement location 50. The placement module 12a, 12b, 12c, 12d may also comprise a second positioning system 16 configured to move along a second axis, wherein the second positioning system 16 is configured to receive a first product 40a, 40b, 40c, 40d from the first positioning system 15 or the first elevator conveyance system 17 and move the first product 40a, 40b, 40c, 40d to a first placement location 51. In this embodiment, the first axis may be parallel to the second axis and the product conveyance system 14 may extend along a third axis perpendicular to the first axis and the second axis. The second positioning system 16 may be configured to move independently of the first positioning system 15.

The placement module 12a, 12b, 12c, 12d may further comprise a first elevator conveyance system 17 and a second elevator conveyance system 18, wherein the first elevator conveyance system 17 is configured to move vertically along a Z-axis 30 and the second elevator conveyance system 18 is configured to move vertically along a Z-axis 30, wherein the first elevator conveyance system 17 is configured to receive products 40a, 40b, 40c, 40d from the product conveyance system 14, wherein the second elevator conveyance system 18 is configured to provide products 40a, 40b, 40c, 40d to the product conveyance system 14.

The assembly machine 10 may be configured to have multiple placement modules 12a, 12b, 12c, 12d arranged in independent split machine line configurations, while still eliminating PCB 40a, 40b, 40c, 40d, 40e handling time including PCB transfer time and PCB acquisition time. The assembly machine 10 may be configured to permit parallel processing of PCBs 40a, 40b, 40c, 40d, 40e in selectable placement modules 12a, 12b, 12c, 12d in the front or rear of lanes of independent split machine line configurations which may permit the reduction or elimination of complete PCB 40a, 40b, 40c, 40d, 40e handling time. A split machine configuration may be particularly advantageous for extreme high-volume production of products such as PCBs 40a, 40b, 40c, 40d, 40e.

In another embodiment, the placement modules 12a, 12b, 12c, 12d may be physically arranged in a series. Often, it is beneficial for the systems output of the placement modules 12a, 12b, 12c, 12d, that are physically arranged in series, to be used in parallel. This way the number of components to be placed by each placement module 12a, 12b, 12c, 12d is not reduced to the total number of components on the PCB 40a, 40b, 40c, 40d, 40e divided by the number of placement modules. This is especially effective in the instance of large PCBs 40e, each with a relatively lower number of components that need to be populated in a high volume.

Figure 5:
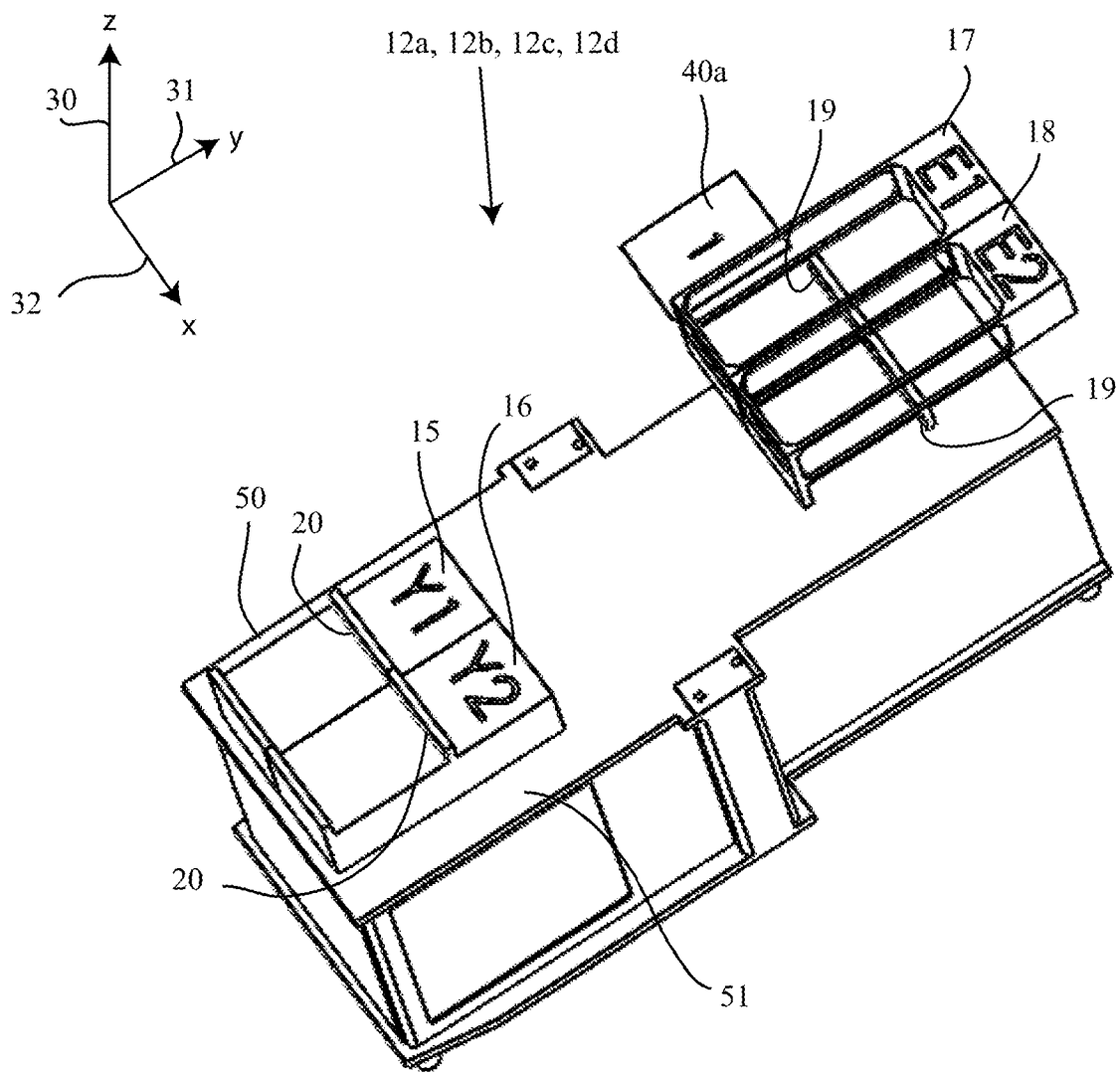
FIG. 5 depicts an embodiment of a placement module receiving a PCB from an up-line input conveyor.

With reference to FIGS. 5-22, the placement module 12, 12b, 12c, 12d is shown receiving PCBs 40a, 40b, 40c from the product conveyance system 14 and at least partially assembling the PCBs 40a, 40b, 40c according to one embodiment. FIG. 5 depicts PCB 40a arriving at the product conveyance system 14. The first elevator conveyance system 17 and the second elevator conveyance system 18 are each shown in a raised position. The raised position may be referred to as a "safe" position, in which the first elevator conveyance system 17 and second elevator conveyance system 18 are positioned such that the first positioning system 15 may move along the first axis and intersect with the product conveyance system 14 underneath the first elevator conveyance system 17 and such that the second positioning system 16 may move along the second axis and intersect with the product conveyance system 14 underneath the second elevator conveyance system 18.

Figure 6:
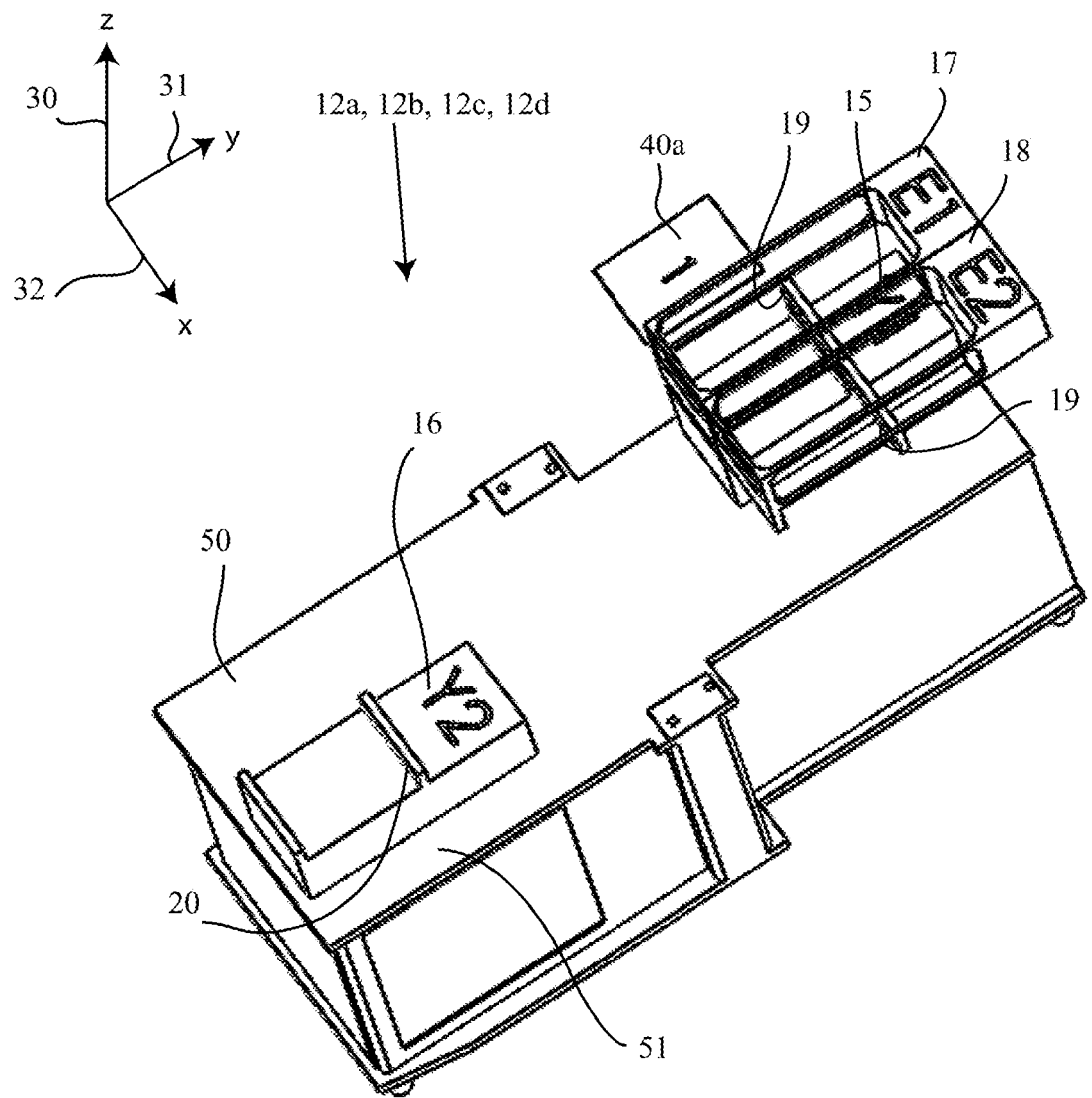
FIG. 6 depicts an embodiment of a first belt conveyor of a first positioning system of the placement module moving into a position to receive a PCB.
Figure 7:
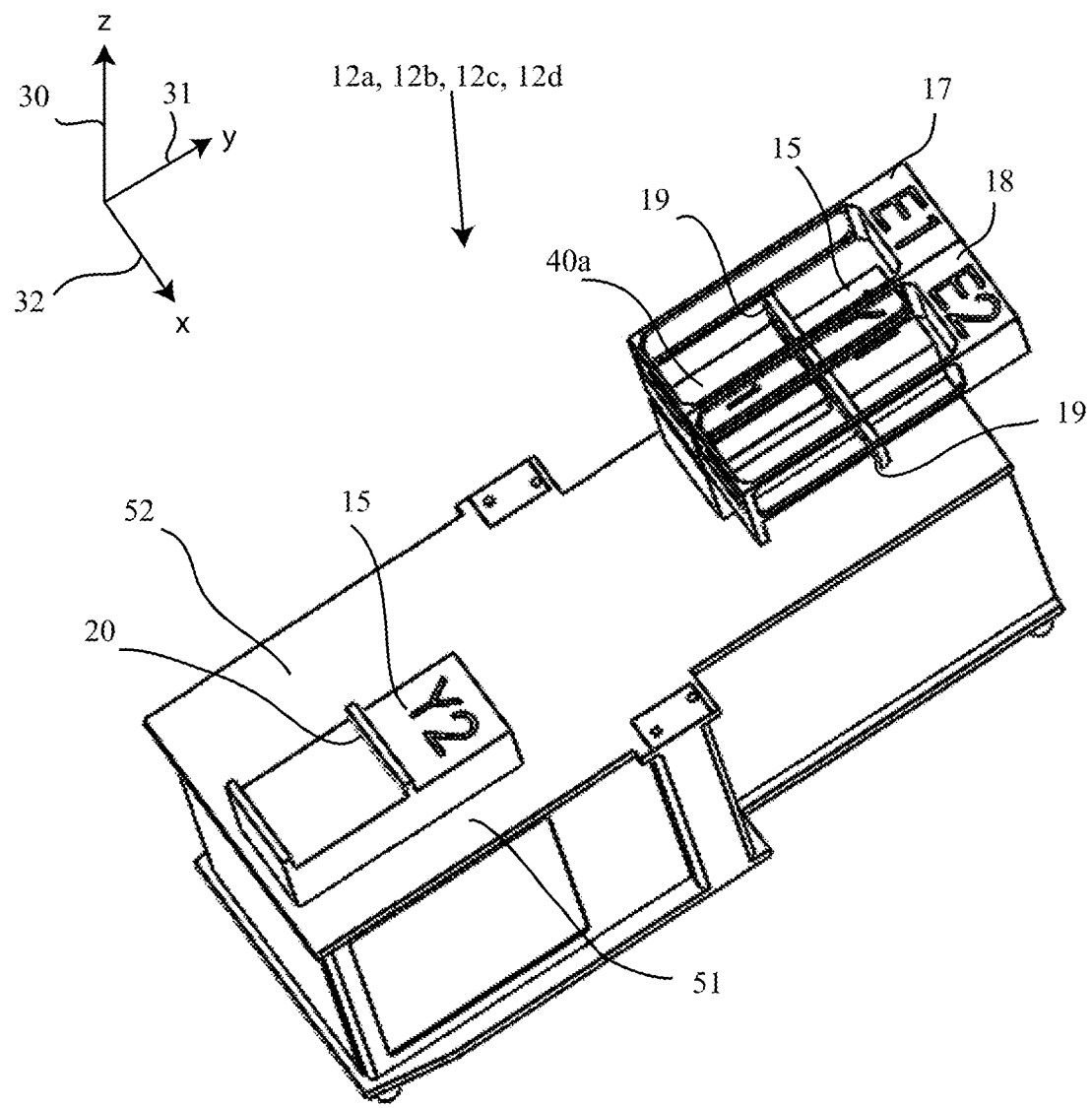
FIG. 7 depicts an embodiment of the first belt conveyor of a first positioning system of the placement module receiving a PCB.
Figure 8:
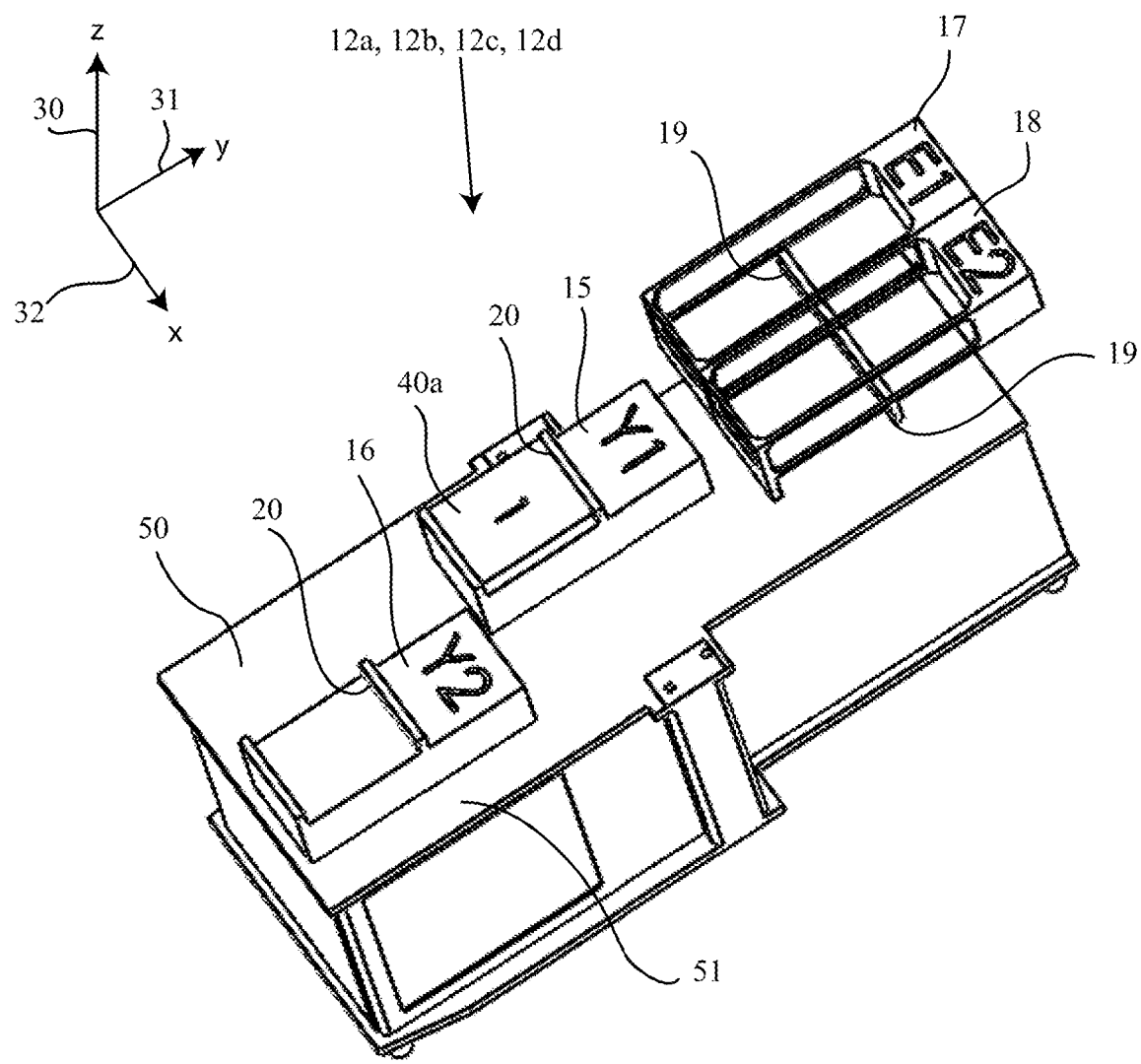
FIG. 8 depicts and embodiment of the first belt conveyor moving a PCB along a Y-axis to the position of a first fiducial marker of the PCB.
Figure 9:
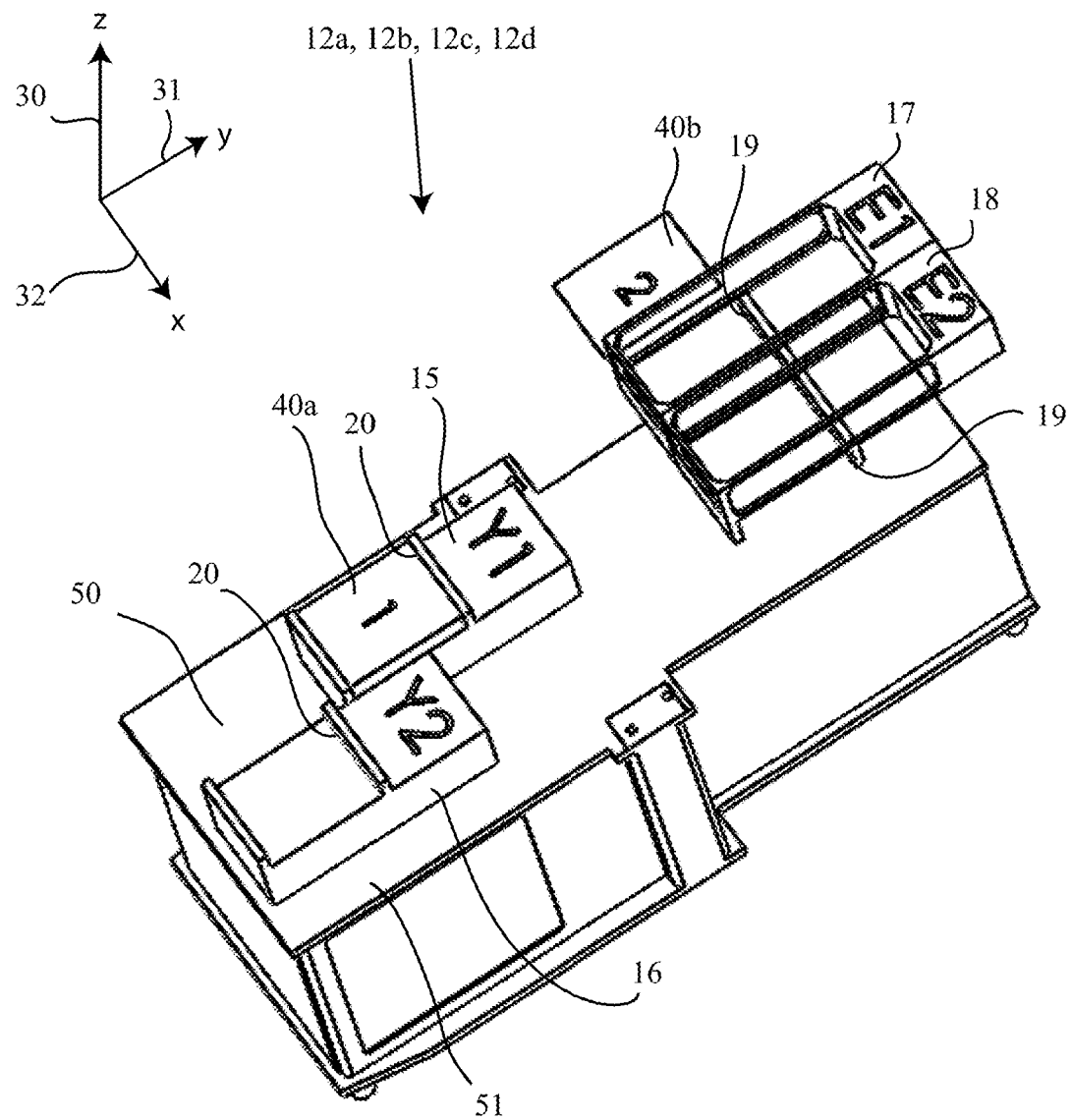
FIG. 9 depicts an embodiment of a PCB on the first belt conveyor being populated by a pick and place head while a second PCB simultaneously arrives at the up-line conveyor of the placement module.

As shown in FIG. 6, the first positioning system 15 may move along the first axis to a transfer position in which the first positioning system 15 intersects with the product conveyance system 14 such that the edge belt conveyor 20 of the first positioning system 15 is positioned to receive PCB 40a. In FIG. 7, the first positioning system 15 is shown having received PCB 40a from the product conveyance system 14. FIG. 8 depicts the first positioning system 15 moving along the first axis towards the first placement location 50. The first positioning system 15 may position a first fiducial marker of PCB 40a such that one or more cameras of one or more dispensing heads of the dispensing head system may locate the first fiducial while the first positioning system 15 moves along the first axis. In FIG. 9, the first positioning system 15 is shown having moved the PCB 40a along the first axis such that the PCB 40a is in the first placement location 50 such that PCB 40a can be at least partially assembled, for example, by a pick and place head of the dispensing head system populating PCB 40a with components. Simultaneously, PCB 40b is shown arriving at the product conveyance system 14.

Figure 10:
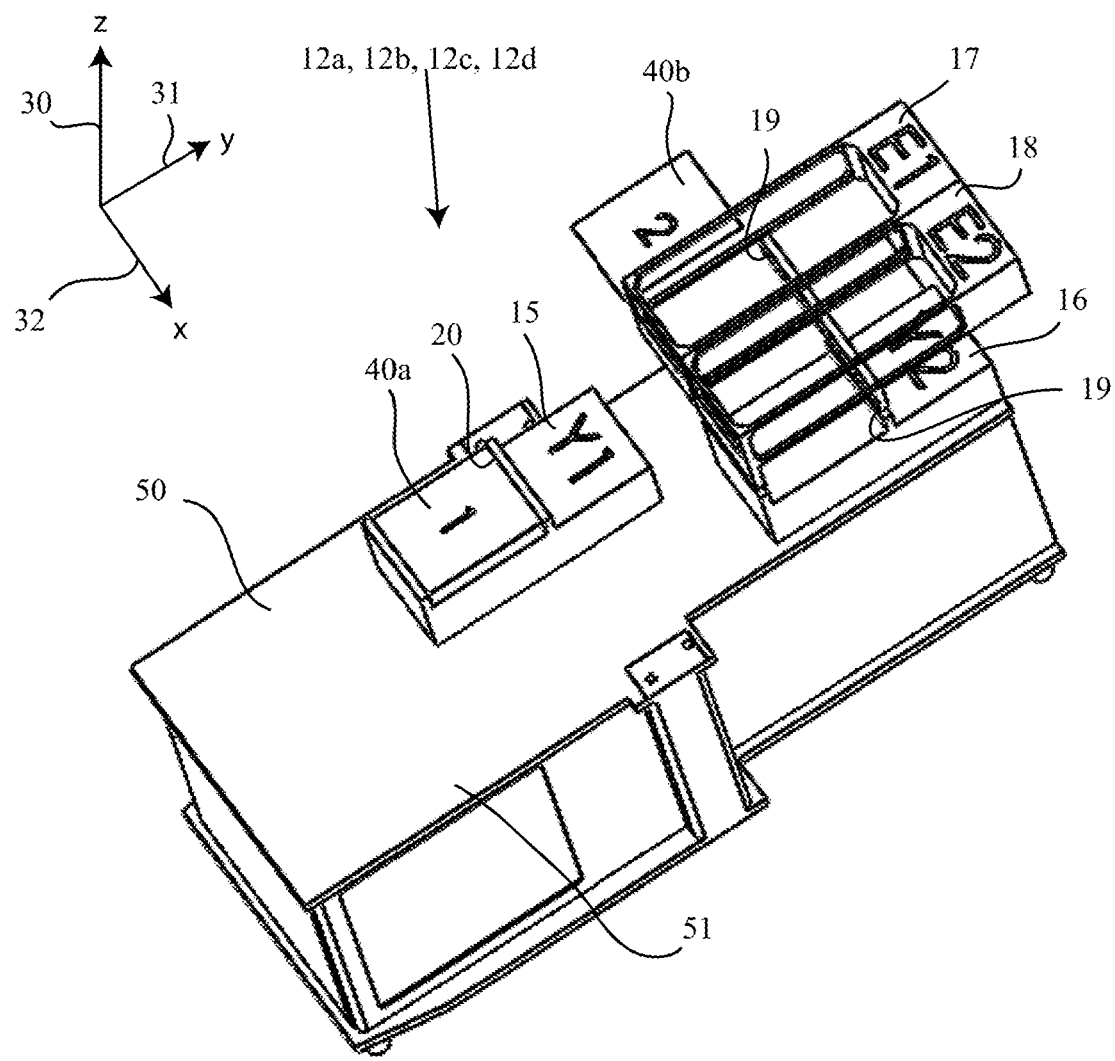
FIG. 10 depicts an embodiment of a second belt conveyor of a second positioning system moving into a transfer position to receive a second PCB while a first PCB simultaneously populates on a first belt conveyor.
Figure 11:
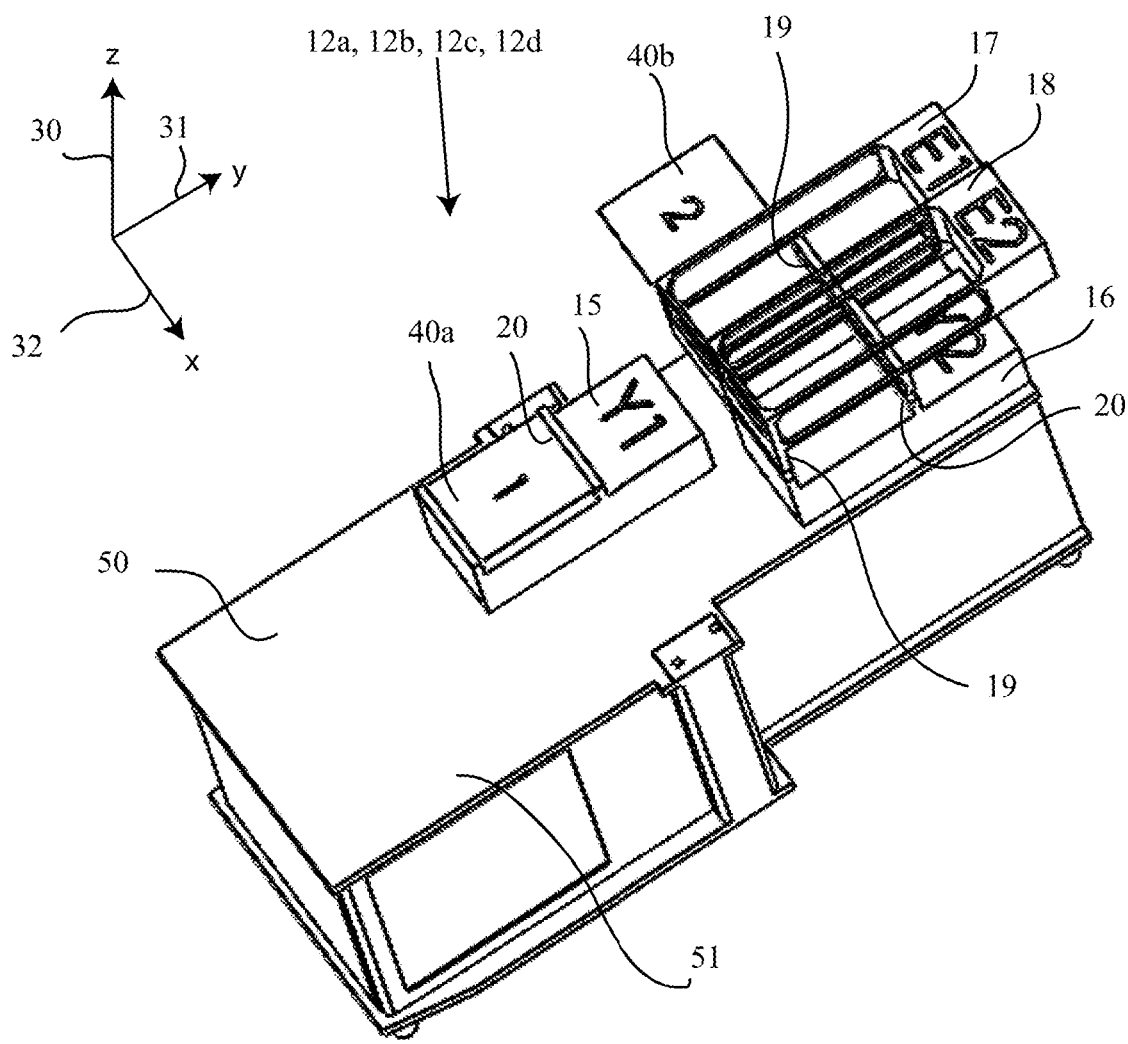
FIG. 11 depicts an embodiment of a first elevator of a placement module lowering into a transfer position to convey a second PCB to a second belt conveyor while a first PCB simultaneously populates on a first positioning system.

As shown in FIG. 10, while PCB 40a is being at least partially assembled at the first placement location 50, the second positioning system 16 may move along the second axis to intersect with the product conveyance system 14 such that the edge belt conveyor 20 of the second positioning system 16 is positioned to receive PCB 40b from the edge belt conveyor 19 of the first elevator conveyance system 17. In FIG. 11, while PCB 40a is being at least partially assembled at the first placement location 50, the first elevator conveyance system 17 is shown lowering into a transfer position. The transfer position may be a position in which the edge belt conveyor 19 of the first elevator conveyance system 17 is aligned with the product conveyance system 14 such that the first elevator conveyance system 17 may receive a product, such as PCB 40b. As shown in FIG. 11, in the transfer position, the edge belt conveyor 19 of the first elevator conveyance system 17 is aligned with the edge belt conveyor 20 of the second positioning system 18 such that PCB 40b may be conveyed to the second positioning system 18 by PCB 40b moving from the edge belt conveyor 19 of the first elevator conveyance system 17 to the edge belt conveyor 20 of the second positioning system 16.

Figure 12:
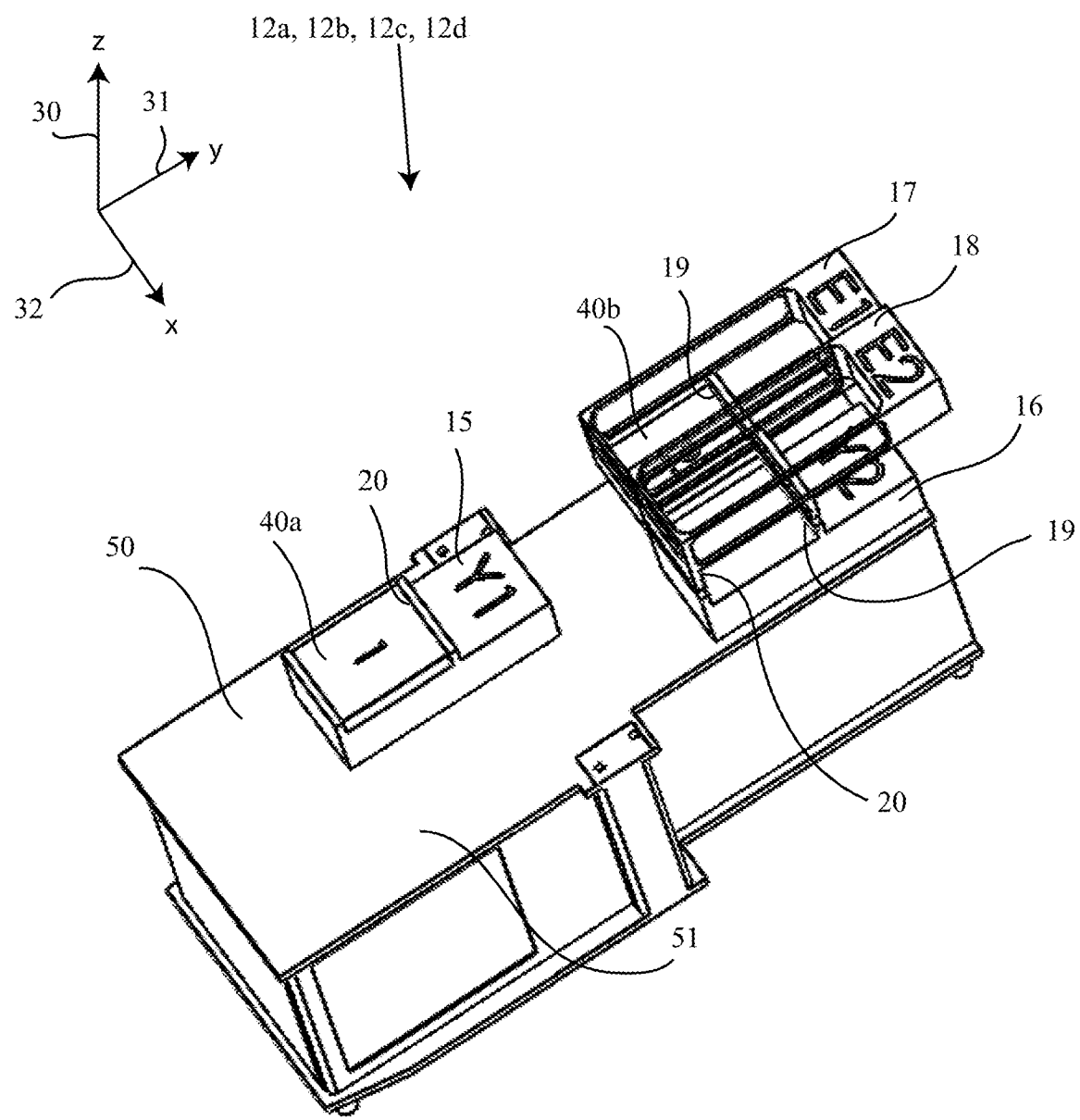
FIG. 12 depicts an embodiment of a first elevator of a placement module conveying a second PCB across the placement module to a second belt conveyor of a second positioning system while a first PCB within a first belt conveyor is being populated by a pick and place head.
Figure 13:
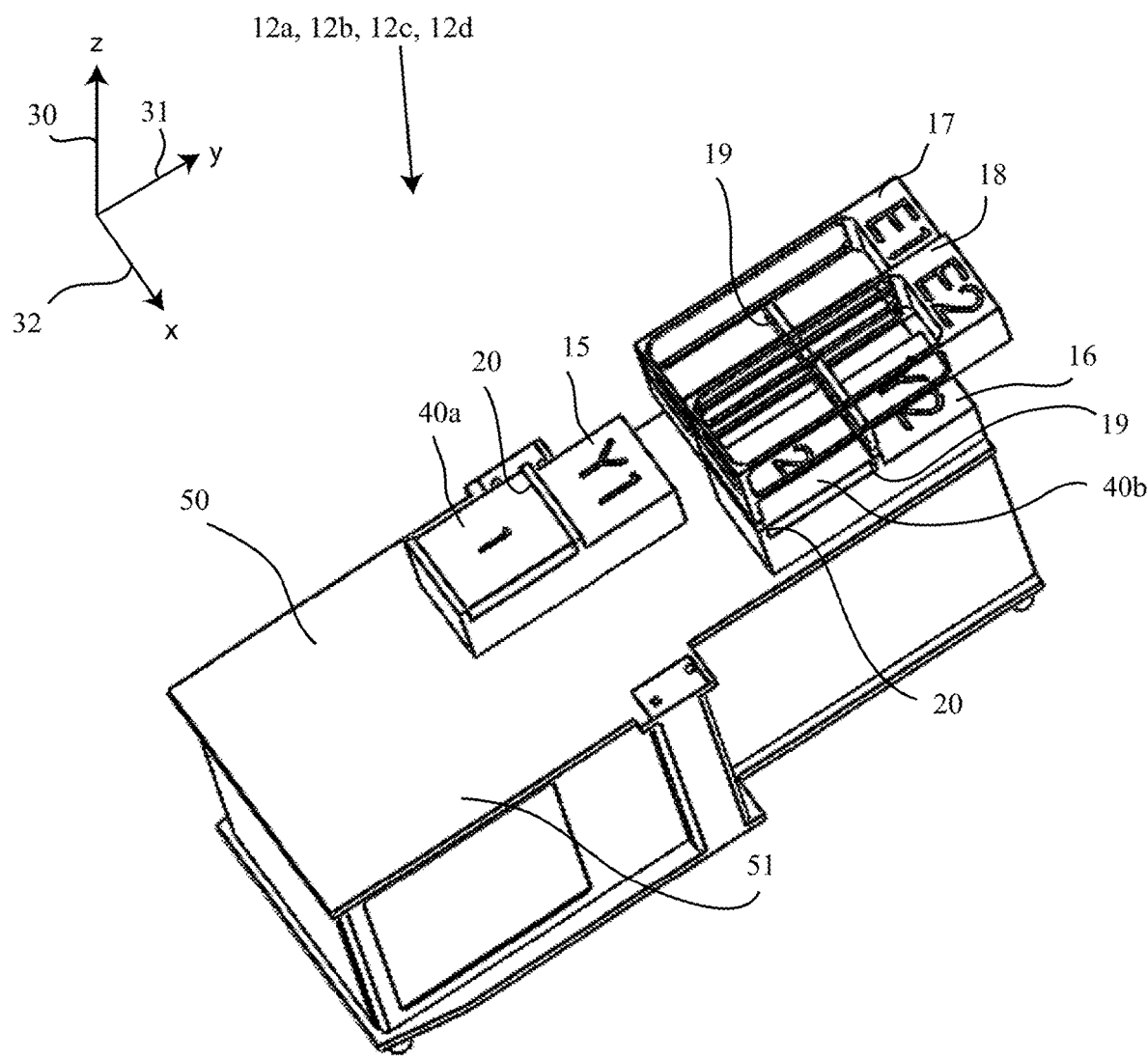
FIG. 13 depicts an embodiment of a second belt conveyor receiving a second PCB while the first PCB on a first positioning system continues to be populated by a pick and place head.
Figure 14:
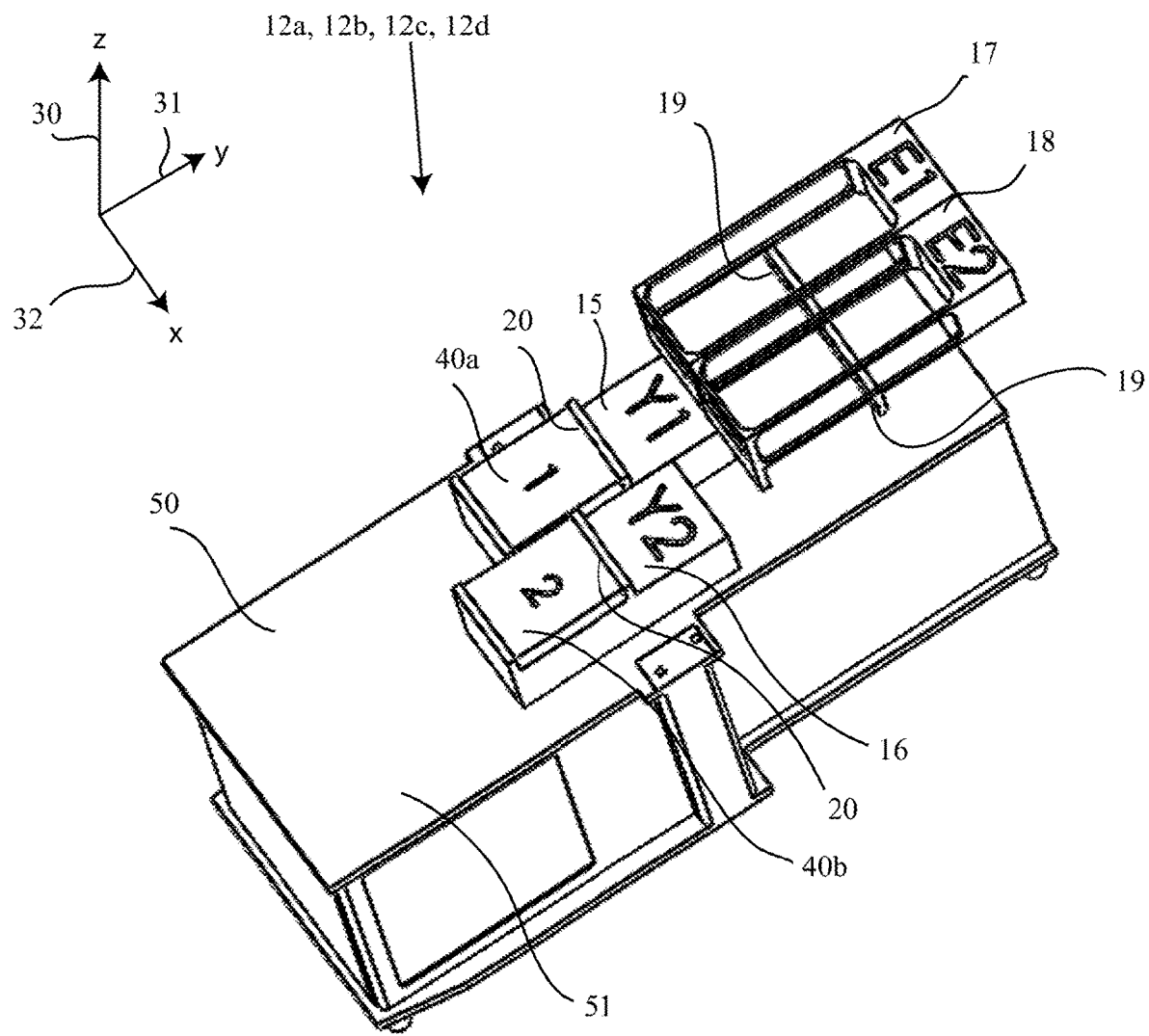
FIG. 14 depicts an embodiment of a first elevator raising upward, while a second belt conveyor of a second positioning system simultaneously moves to a position of a first fiducial marker of a second PCB, while a first PCB simultaneously is populated by a pick and place head.
Figure 15:
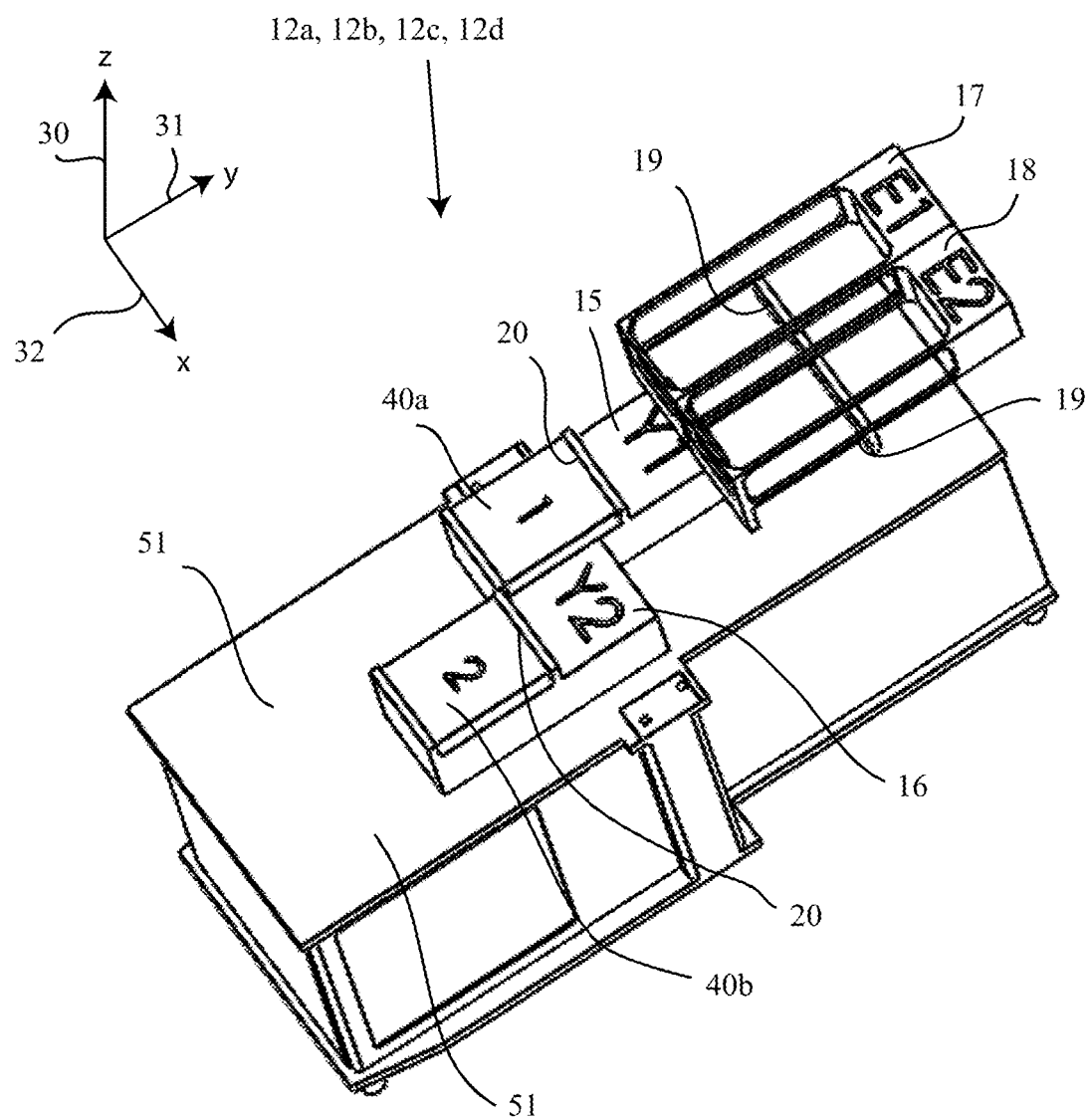
FIG. 15 depicts an embodiment of a second PCB moving to a second fiducial marker, while the first PCB is simultaneously populated.

In FIG. 12, while PCB 40a is being at least partially assembled at the first placement location 50, the first elevator conveyance system 17 is shown having received PCB 40b from the product conveyance system 14. As shown in FIG. 13, while PCB 40a is being at least partially assembled at the first placement location 50, PCB 40b is conveyed across the placement module to the second positioning system 16 from the first elevator conveyance system 17. In FIG. 14, while PCB 40a is being at least partially assembled at the first placement location 50, the first elevator conveyance system 17 is shown rising to a safe position while the second positioning system 16 simultaneously moves along the second axis toward the second placement location 51. The second positioning system 16 may position a second fiducial marker of PCB 40b by moving along the second axis. As shown in FIG. 15, while PCB 40a is being at least partially assembled at the first placement location 50, the second positioning system 16 may move PCB 40b to a second fiducial marker to begin at least partially assembling PCB 40b after the at least partial assembly of PCB 40a is completed, for example, by a next pick and place head of the dispensing head system populating PCB 40b with components.

Figure 16:
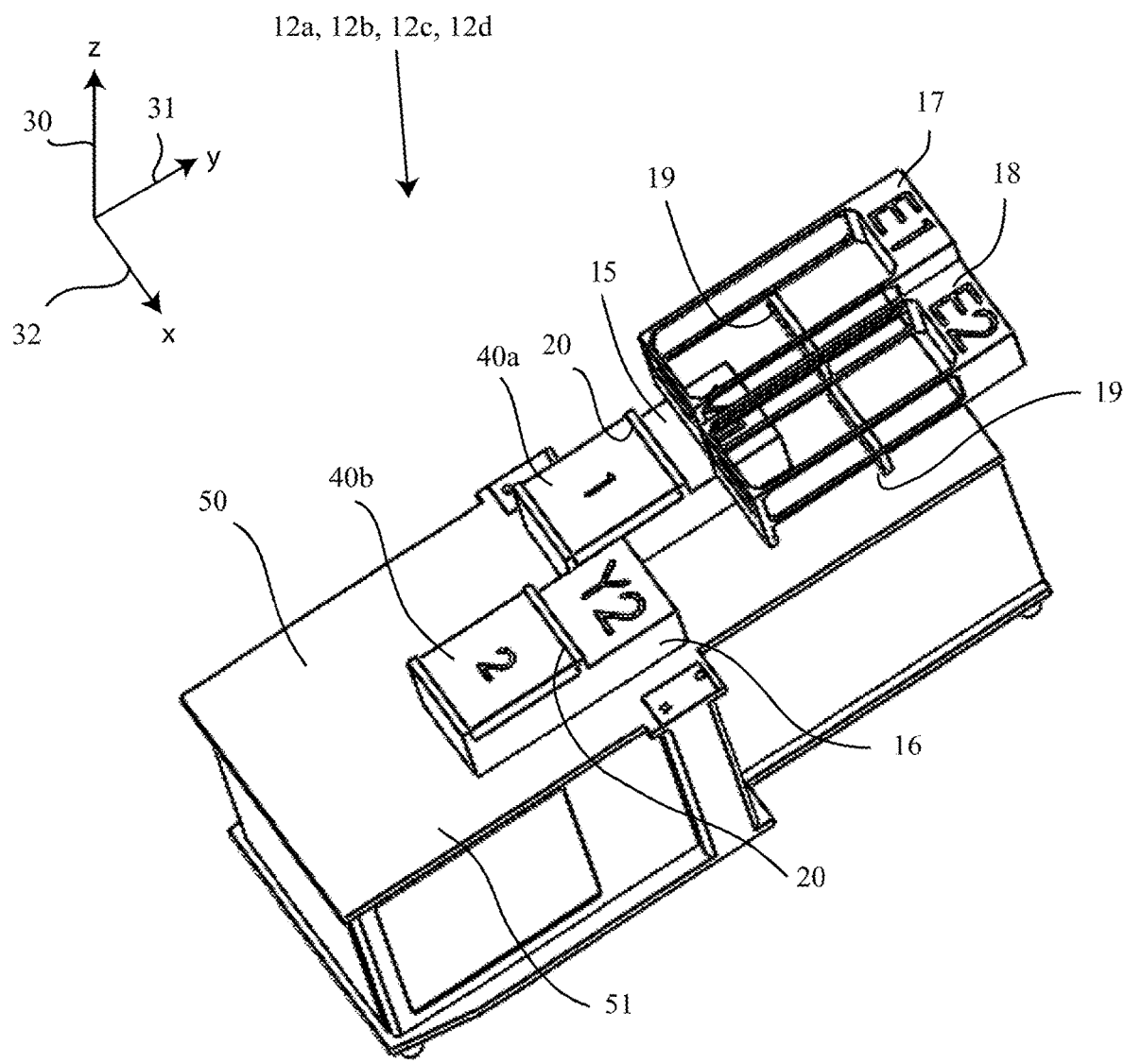
FIG. 16 depicts an embodiment of a second elevator lower into a transfer position while the second PCB continues to be populated by a pick and place head.
Figure 17:
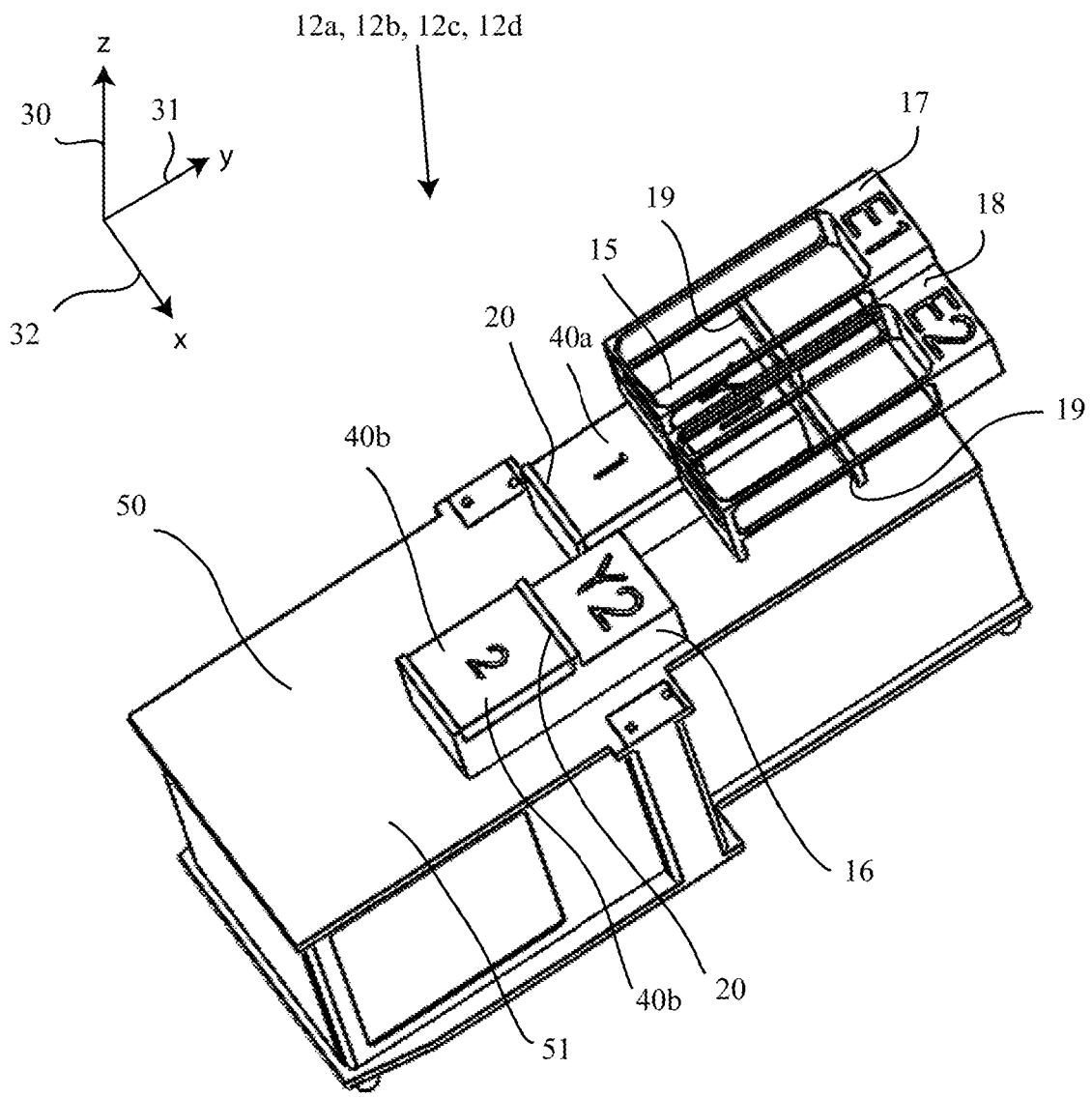
FIG. 17 depicts an embodiment of a placement module, wherein after a first PCB has finished populating, the belt conveyor of the first positioning system moves to a transfer position while a second PCB in a second conveyor belt continues to simultaneously be populated by a pick and place head.
Figure 18:
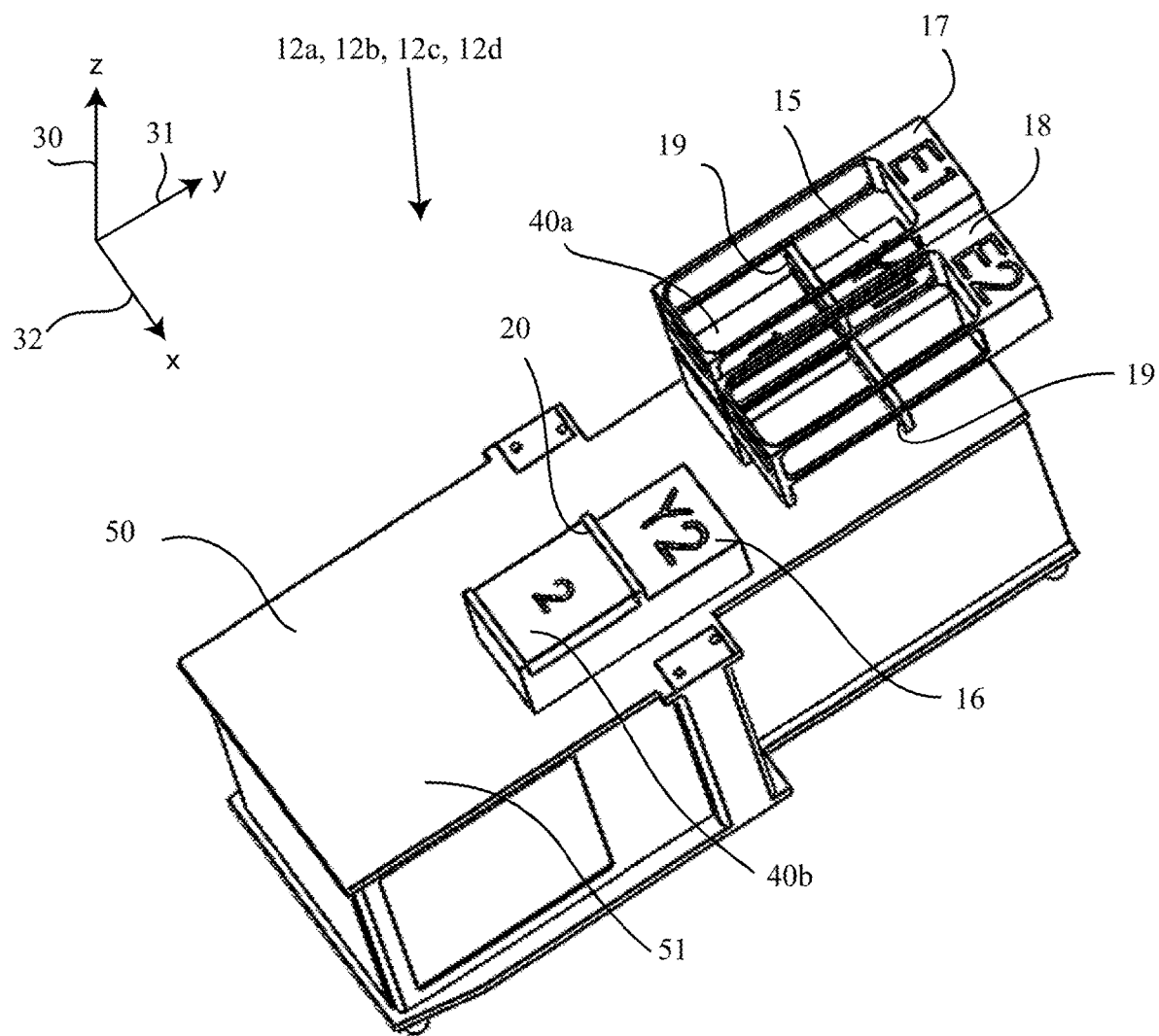
FIG. 18 depicts an embodiment of a placement module, wherein a belt conveyor of a first positioning system comprising a populated PCB has moved into a transfer position adjacent to a lowered elevator, while a second PCB is simultaneously populated by a pick and place head.
Figure 19:
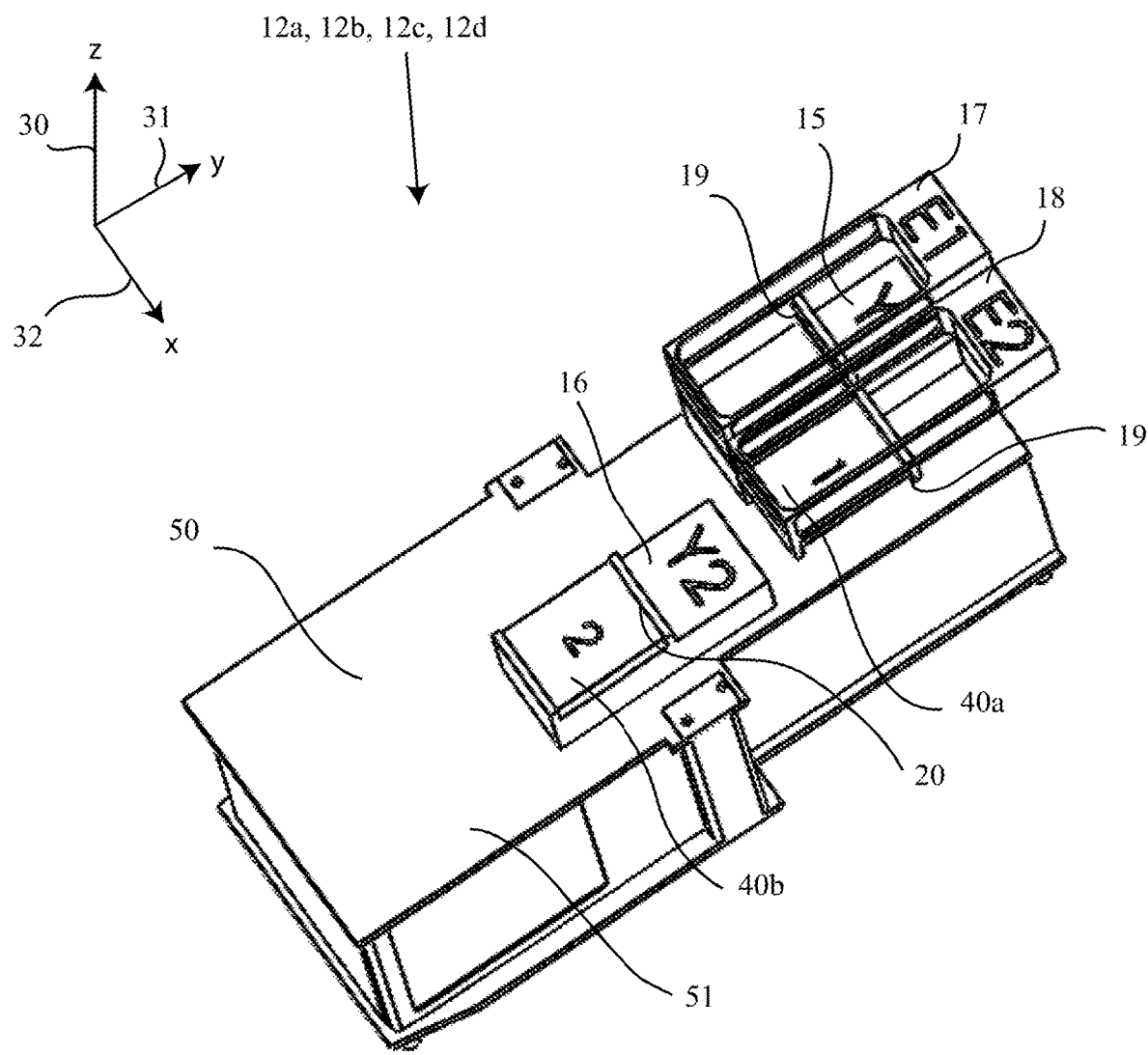
FIG. 19 depicts an embodiment of a placement module, wherein a populated PCB is transferred from the belt conveyor of a first positioning system to a conveyor of a second elevator lowered into a transfer position, while a second PCB continues to be populated by a pick and place head.
Figure 20:
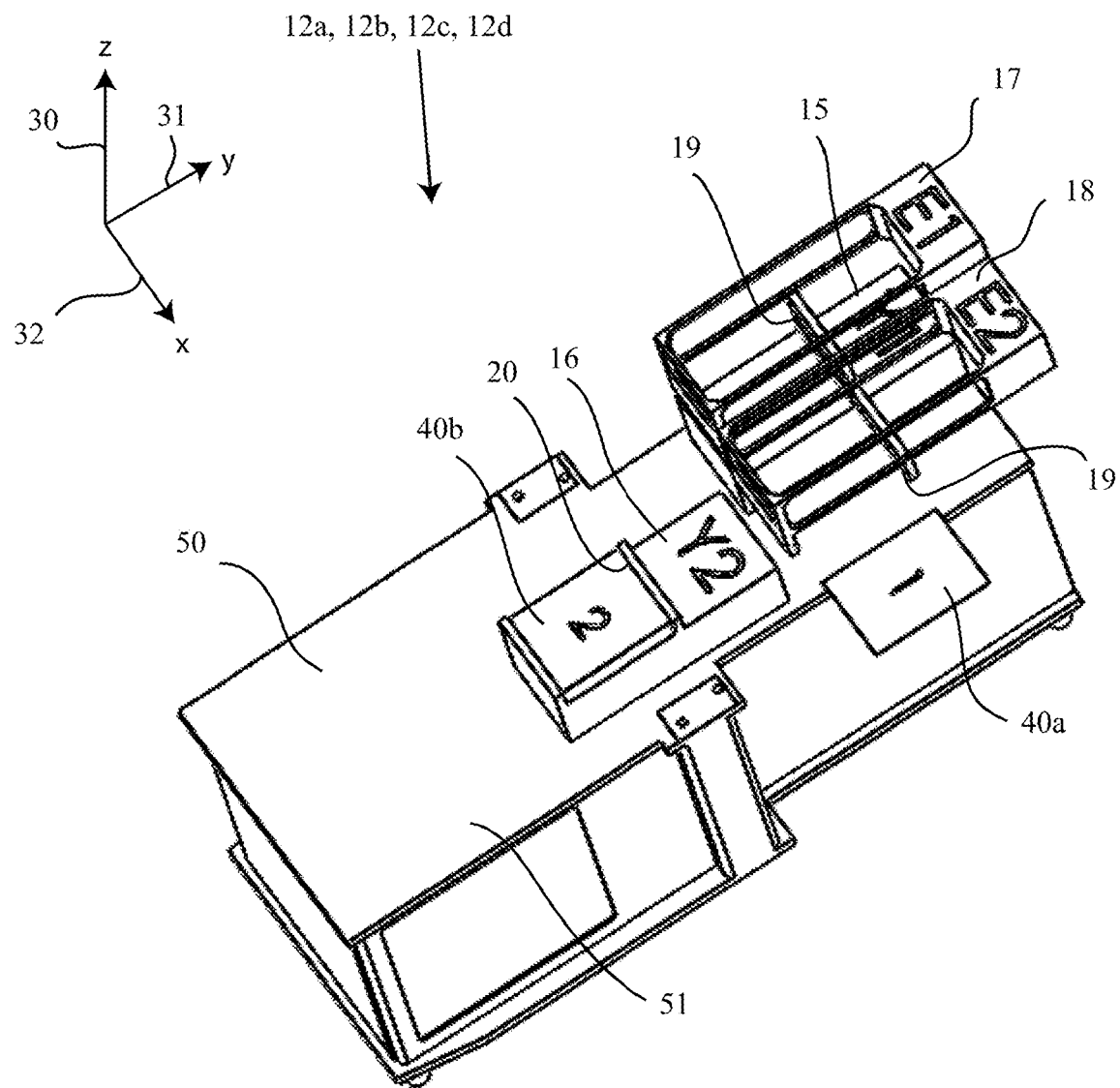
FIG. 20 depicts an embodiment of a placement module, wherein a populated PCB is conveyed down the line from the placement module via a conveyor of a second elevator while a second PCB is simultaneously being populated.
Figure 21:
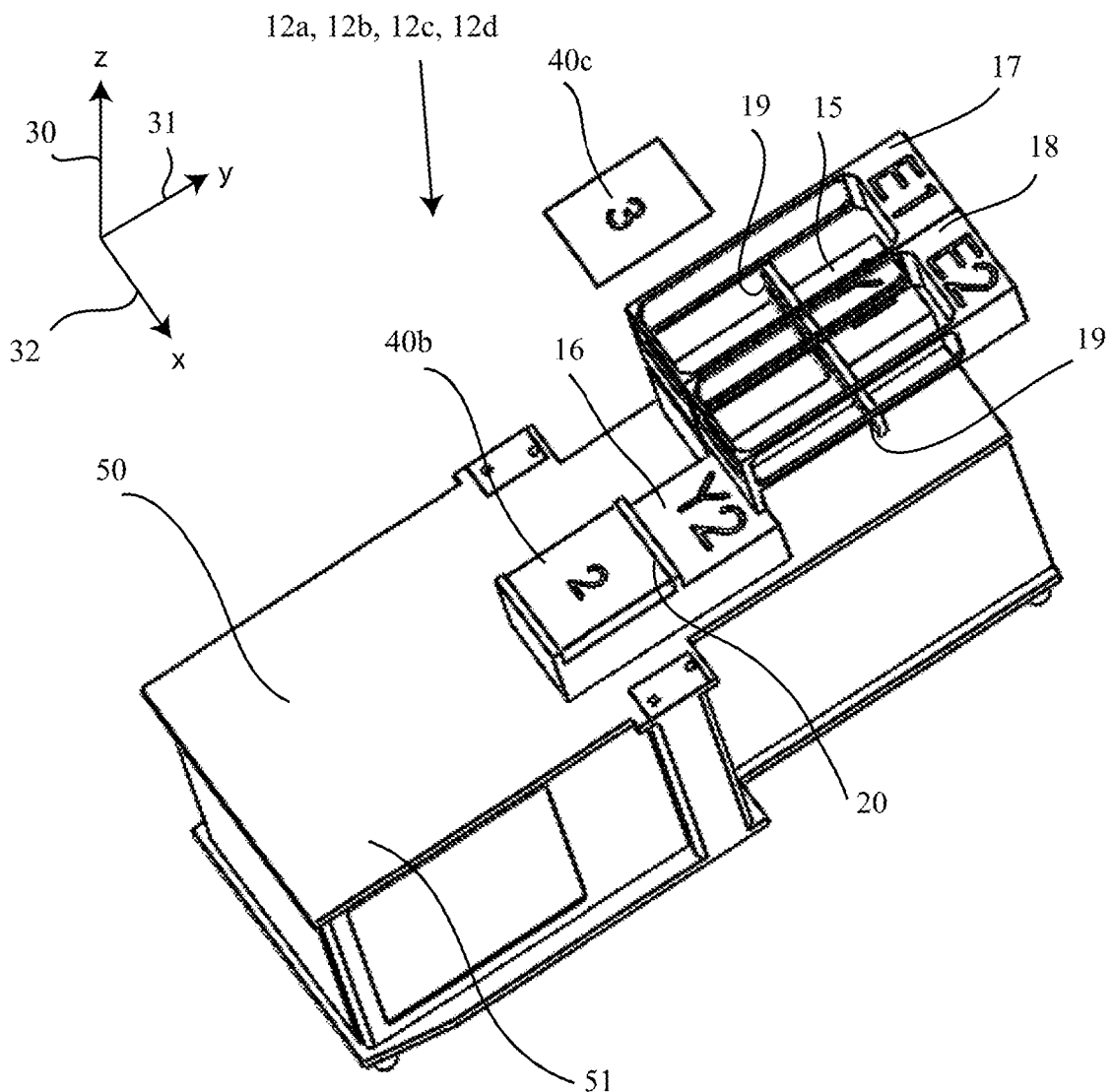
FIG. 21 depicts an embodiment of a placement module, wherein the second elevator raises upward and a belt conveyor of a first positioning system waits to receive a third PCB to arrive from an up-line conveyor, while a second PCB continues to be populated.
Figure 22:
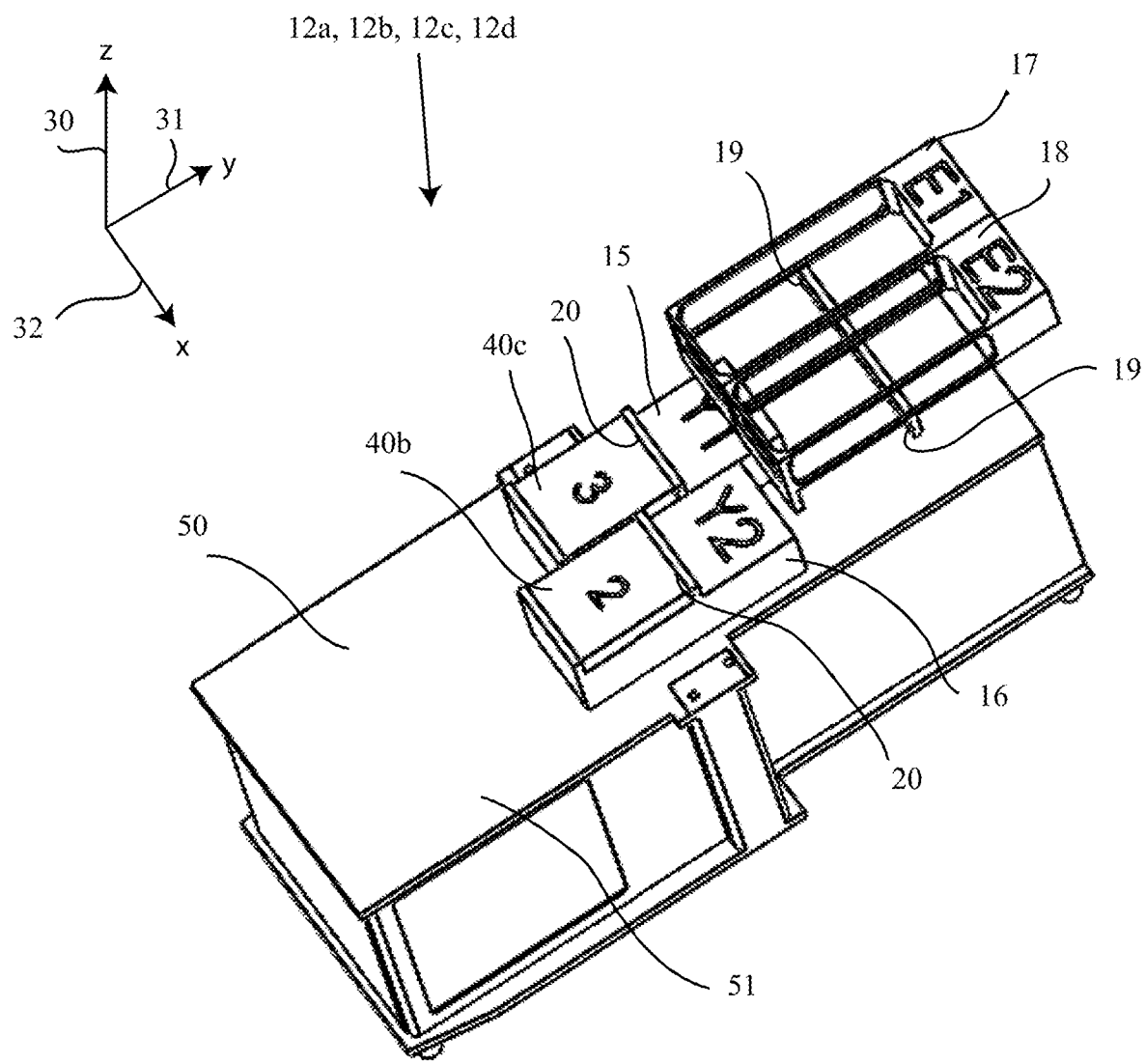
FIG. 22 depicts an embodiment of a placement module wherein the first conveyor, after receiving a third PCB, is moving to a first fiducial mark of the third PCB while the second PCB on a second conveyor continues populating.

As shown in FIG. 16, while PCB 40b is being at least partially assembled at the second placement location 51, the second elevator conveyance system 18 may lower into a transfer position. In FIG. 17, while PCB 40b is being at least partially assembled at the second placement location 51, the first positioning system 15 moves along the first axis to intersect with the product conveyance system 14 in a transfer position. In FIG. 18, while PCB 40b is being at least partially assembled at the second placement location 51, the first positioning system 15 is shown in a transfer position under the first elevator conveyance system 17 and adjacent to the second elevator conveyance system 18 such that the edge conveyor belt 20 of the first positioning system 15 is aligned with the edge belt conveyor 19 of the second elevator conveyance system 18 such that PCB 40a may be conveyed to the second elevator conveyance system 18 by PCB 40a moving from the edge belt conveyor 20 of the first positioning system 15 to the edge belt conveyor 19 of the second elevator conveyor system 18. As shown in FIG. 19, while PCB 40b is being at least partially assembled at the second placement location 51, the second elevator conveyance system 18 is shown having received PCB 40a from the first positioning system 15. In FIG. 20, while PCB 40b is being at least partially assembled at the second placement location 51, PCB 40a is shown being conveyed down the line from the placement module 12a, 12b, 12c, 12d, for example, PCB 40a, having been at least partially assembled, may be provided to the product conveyance system 14. As shown in FIG. 21, while PCB 40b is being at least partially assembled at the second placement location 51, the second elevator conveyance system 18 may raise into a safe position, and the first positioning system 15 may wait in the transfer position to receive another PCB 40c from the product conveyor system 14. In FIG. 22, the first positioning system 15 is shown having received PCB 40c while PCB 40b completes at least partial assembly on the second positioning system 16. The first positioning system 15 is shown moving along the first axis toward the first placement location 50. The first positioning system 15 may position the first fiducial mark of PCB 40c by moving the first positioning system 15 along the first axis. The placement module 12a, 12b, 12c, 12d may continue through this sequence shown in FIGS. 5-22 with another PCB 40d, or any number of additional PCBs or other products.

Figure 23:
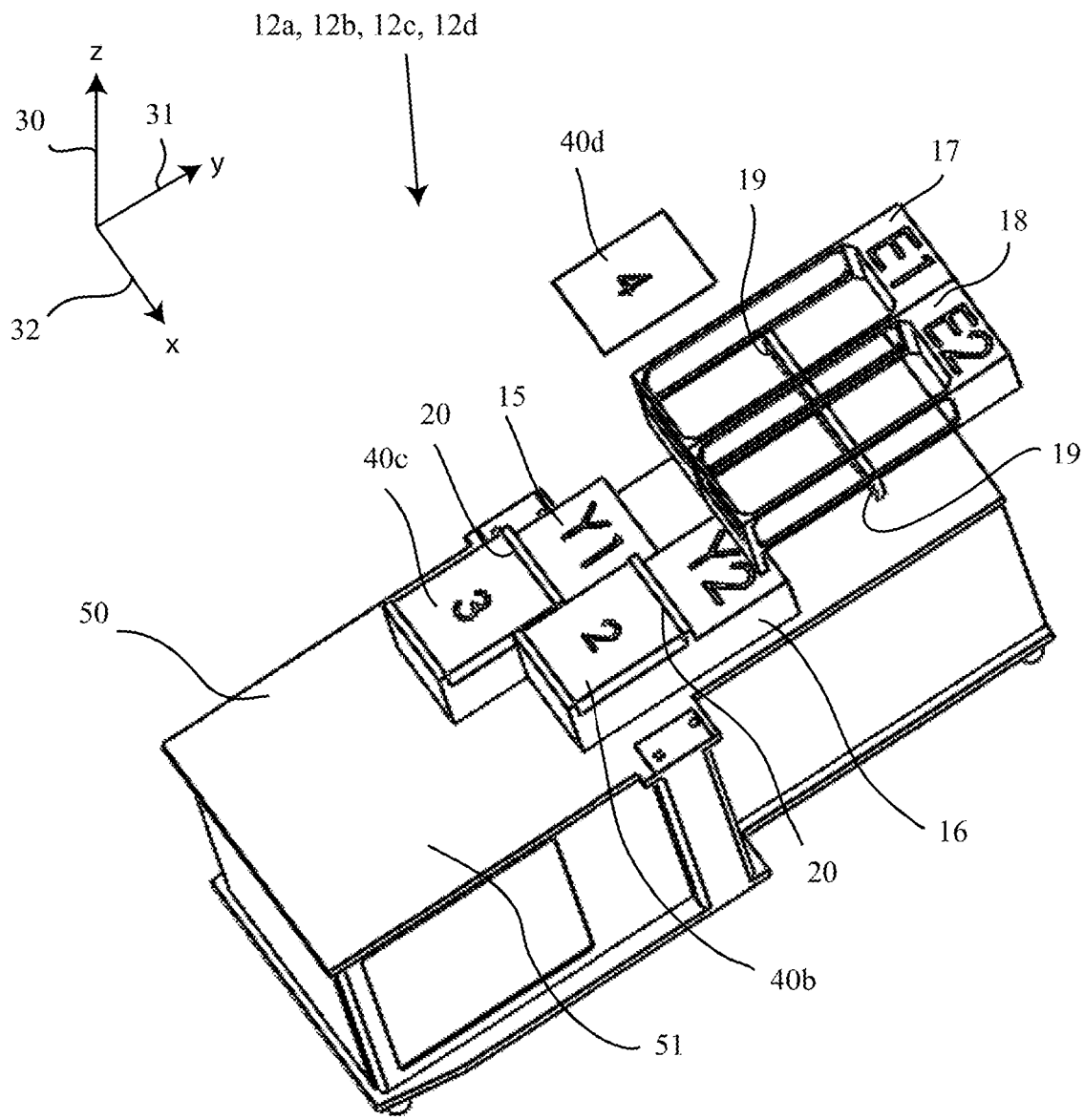
FIG. 23 depicts and embodiment of a placement module allowing for PCB bypass to additional placement modules operating parallel to the placement module, wherein a fourth PCB arrives at an up-line conveyor while the third PCB on the first belt conveyor of the first positioning system is ready to be populated and the second PCB on the second belt conveyor of the second positioning system is being populated.
Figure 24:
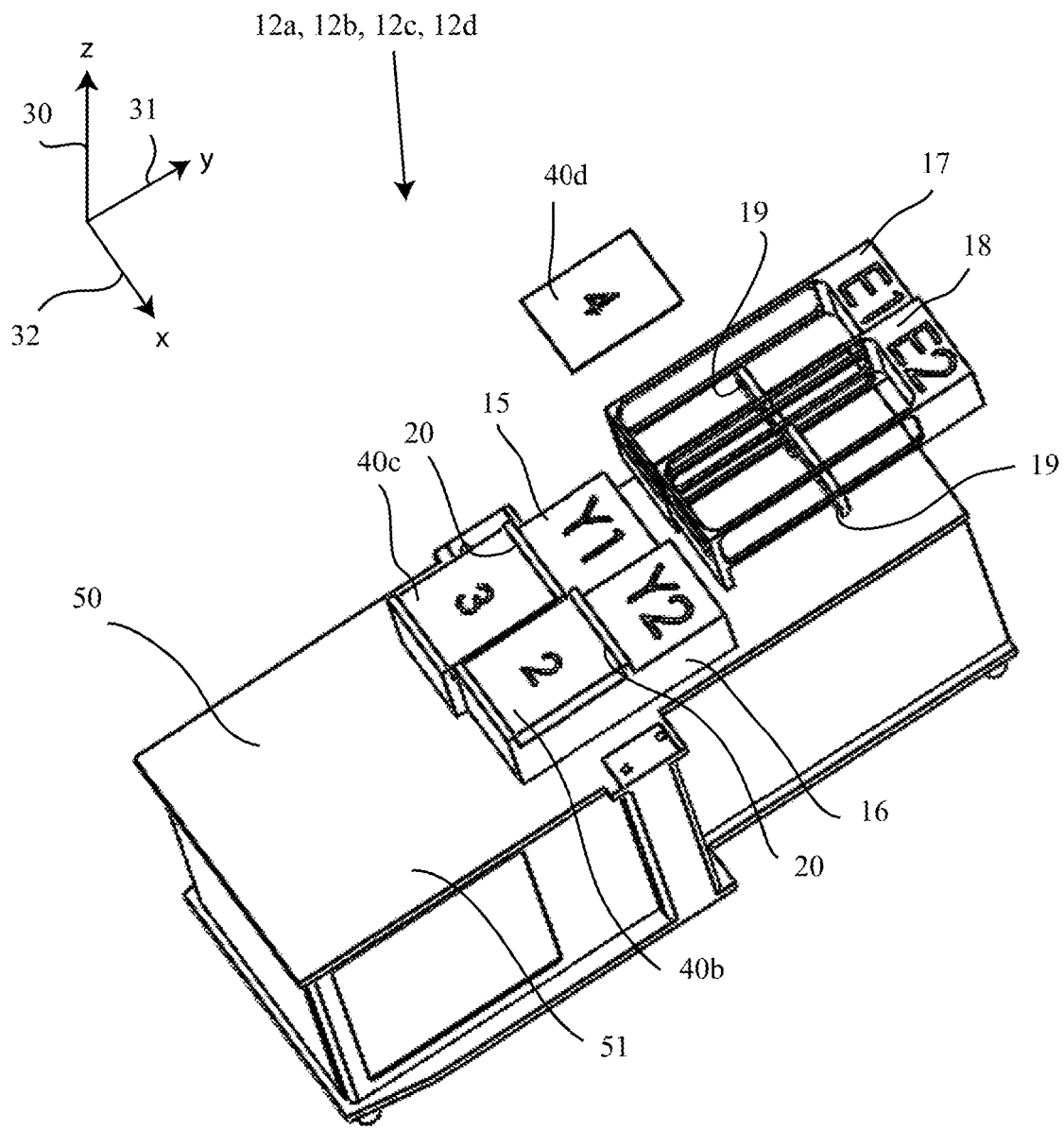
FIG. 24, depicts the embodiment of the placement module of FIG. 23, wherein a first elevator lowers into a transfer position to receive the fourth PCB while the third PCB on the first belt conveyor of the first positioning system is ready to be populated and the second PCB on the second belt conveyor of the second positioning system is being populated.
Figure 25:
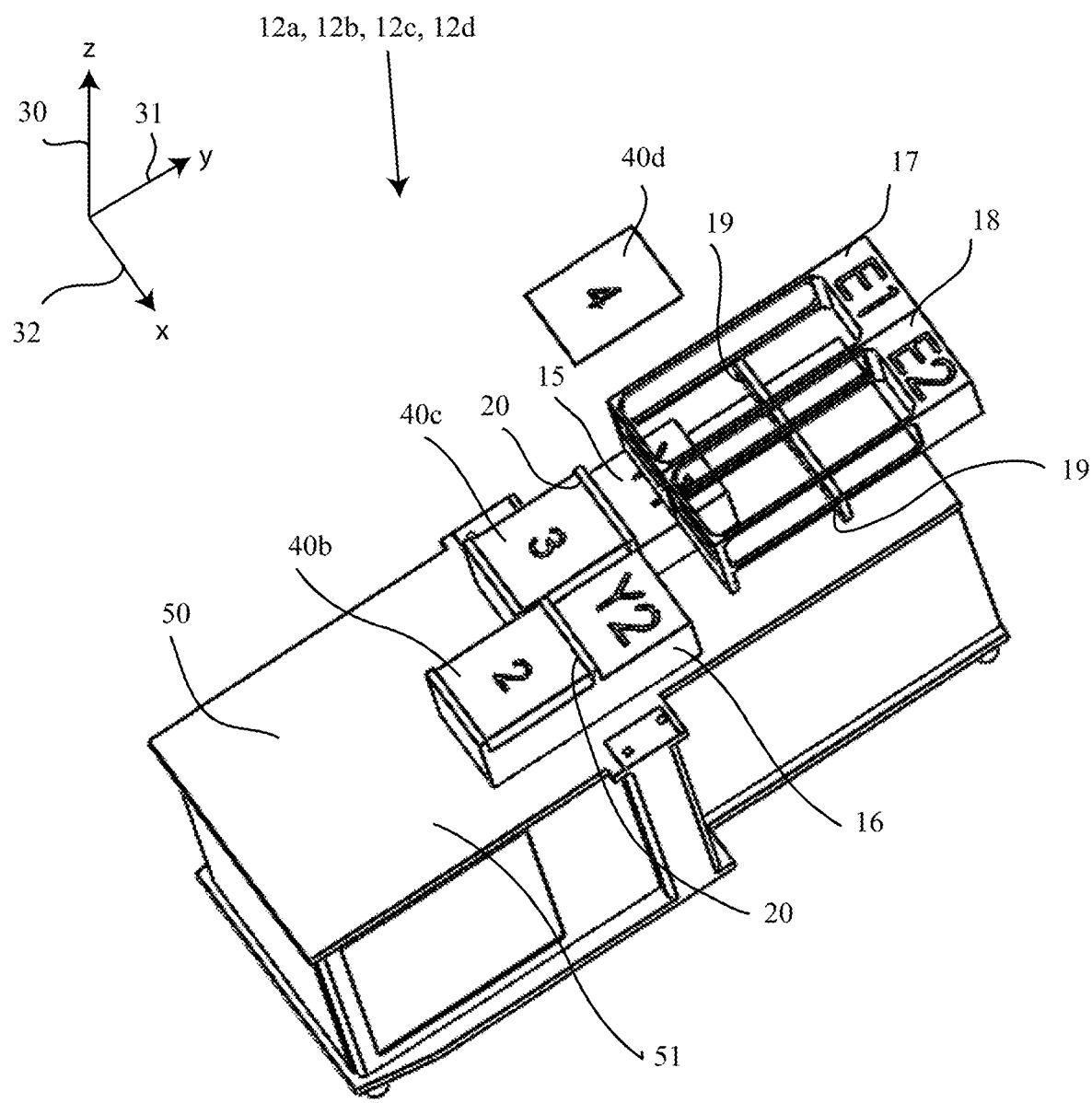
FIG. 25 depicts the embodiment of the placement module of FIG. 24, wherein the second elevator lowers into a transfer position to receive the fourth PCB while the third PCB on the first belt conveyor of the first positioning system is ready to be populated and the second PCB on the second belt conveyor of the second positioning system is being populated.
Figure 26:
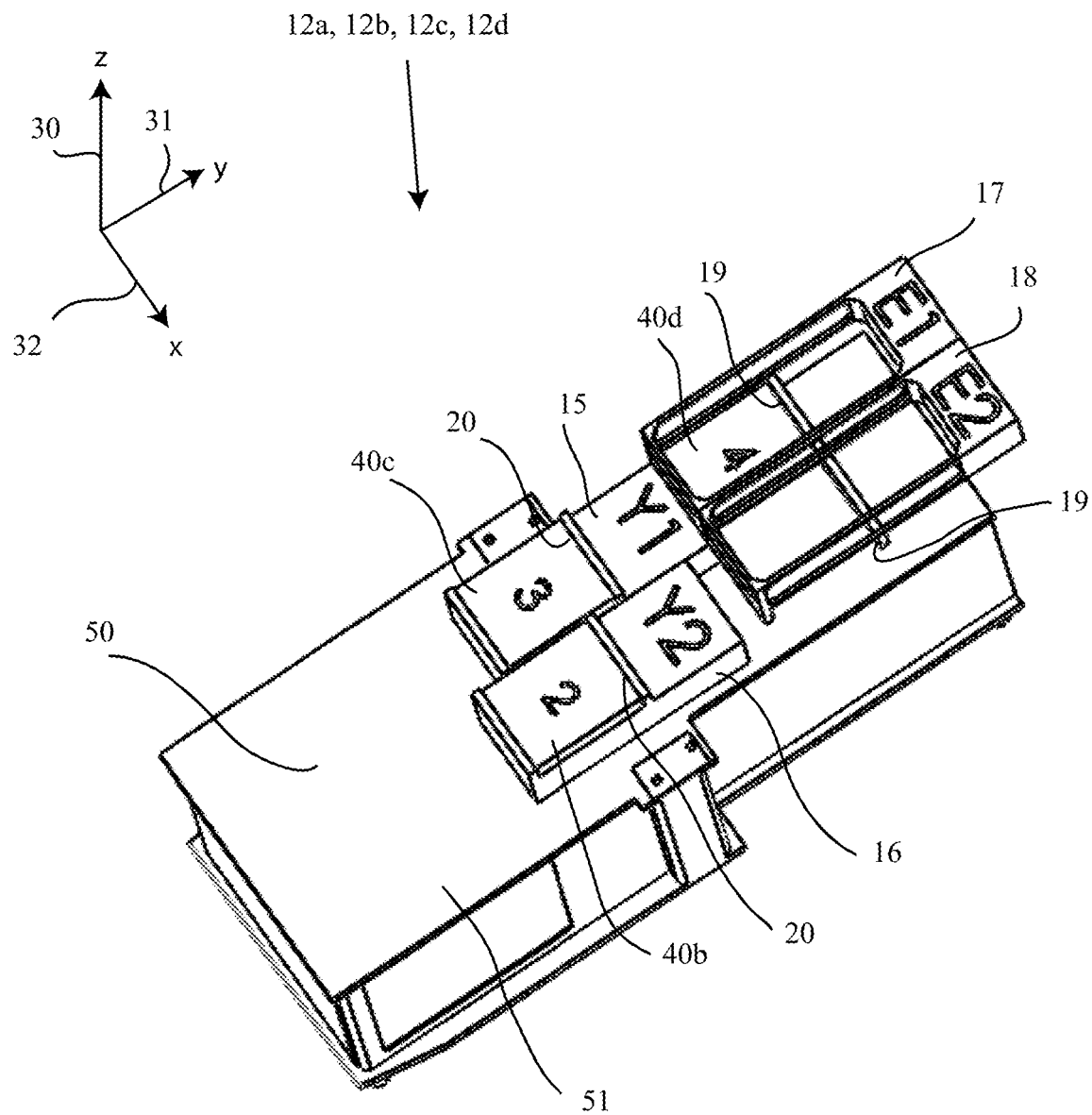
FIG. 26 depicts the embodiment of the placement module of FIG. 25, wherein the fourth PCB is conveyed across the first elevator while the third PCB on the first belt conveyor of the first positioning system is ready to be populated and the second PCB on the second belt conveyor of the second positioning system is being populated.
Figure 27:
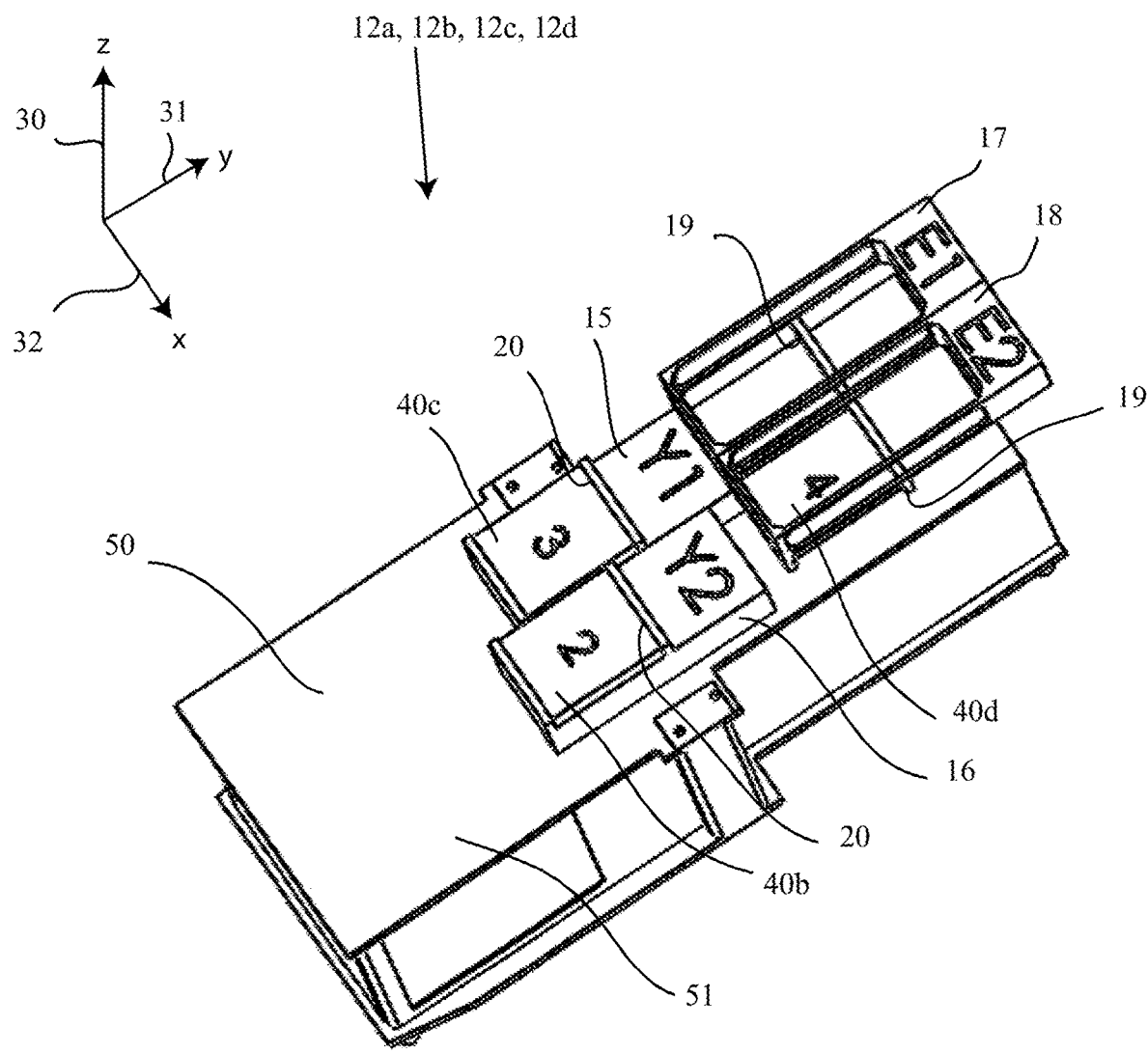
FIG. 27 depicts the embodiment of the placement module of FIG. 26, wherein the fourth PCB is conveyed from the conveyor of the first elevator to the conveyor of the second elevator while the third PCB on the first belt conveyor of the first positioning system is ready to be populated and the second PCB on the second belt conveyor of the second positioning system is being populated.
Figure 28:
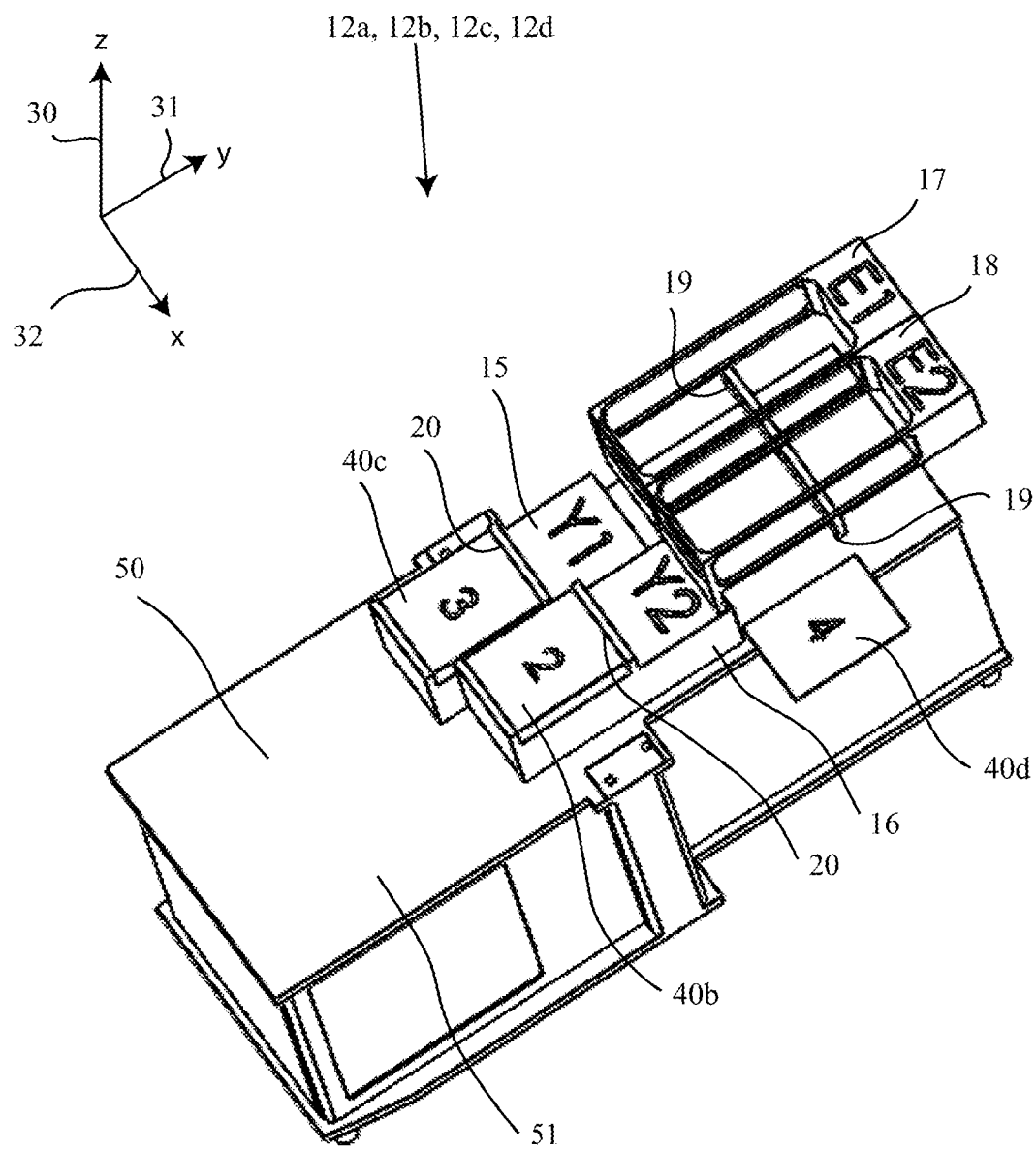
FIG. 28 depicts the embodiment of the placement module of FIG. 27, wherein the fourth PCB is conveyed from the conveyor of the second elevator onto a downline conveyor while the third PCB on the first belt conveyor of the first positioning system is ready to be populated and the second PCB on the second belt conveyor of the second positioning system is being populated.
Figure 29:
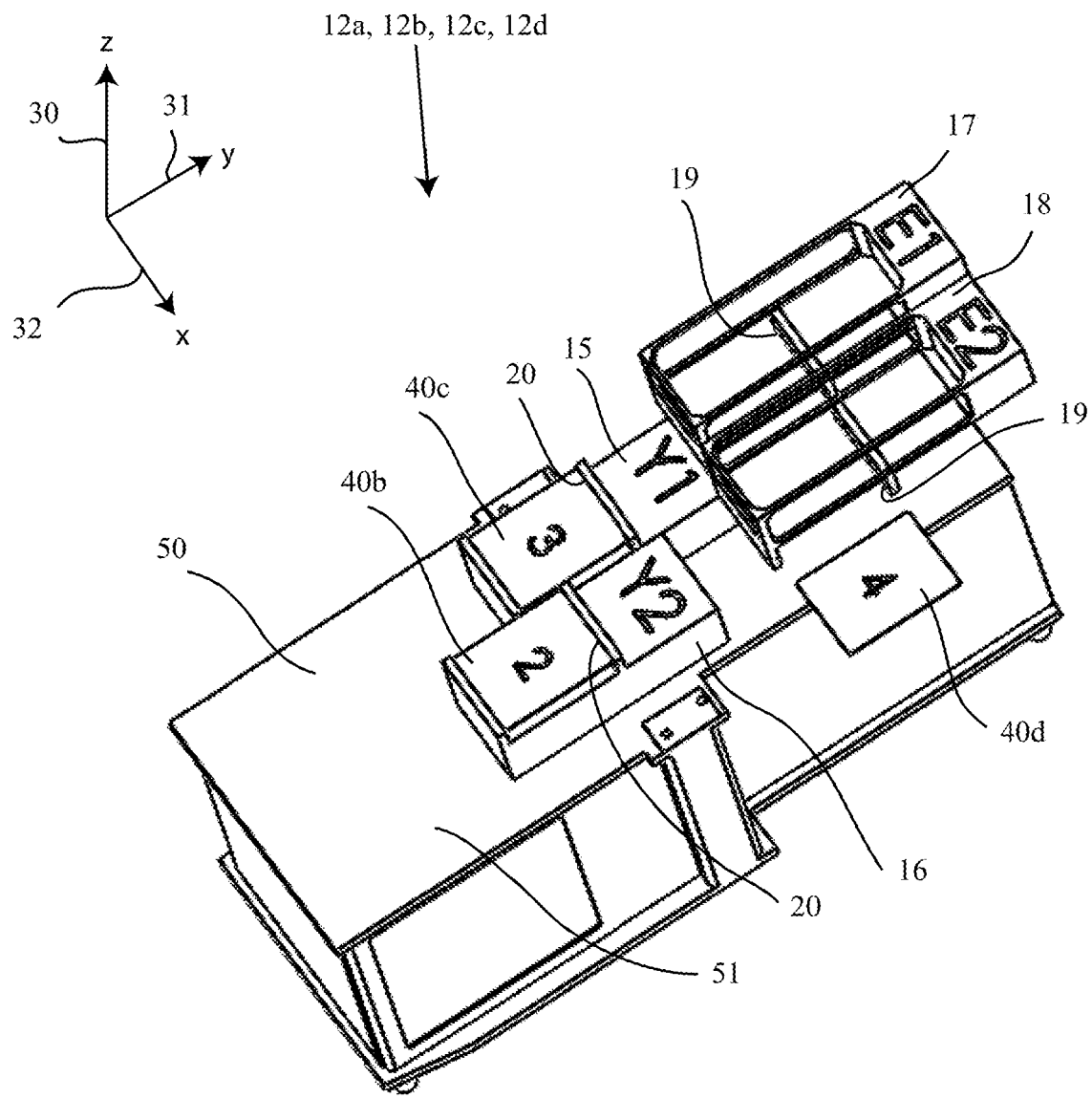
FIG. 29 depicts the embodiment of the placement module of FIG. 28, wherein the first elevator raises upward to a safe position while the third PCB on the first belt conveyor of the first positioning system is ready to be populated and the second PCB on the second belt conveyor of the second positioning system is being populated.
Figure 30:
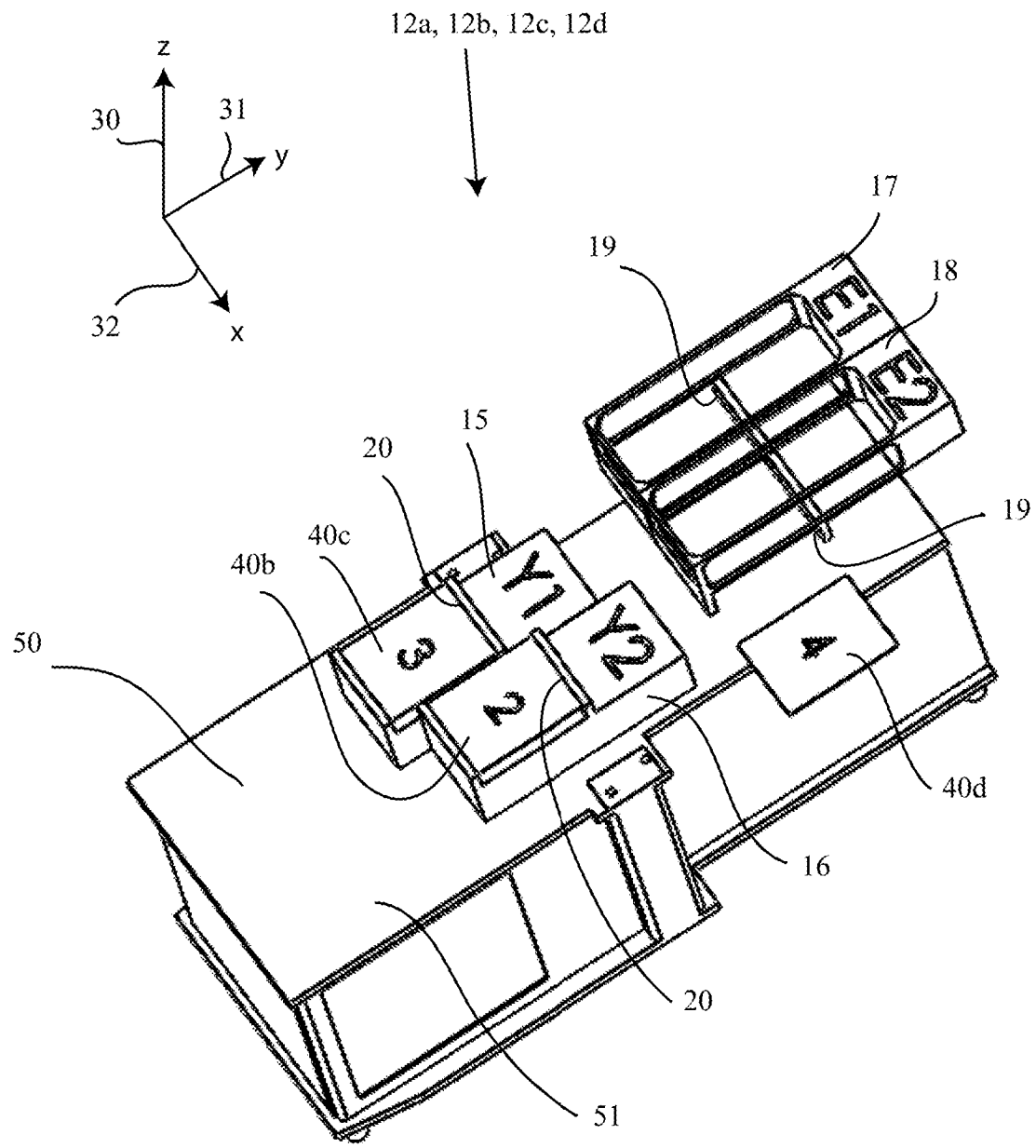
FIG. 30 depicts the embodiment of the placement module of FIG. 29, wherein the second elevator raises upward to a safe position while the third PCB on the first belt conveyor of the first positioning system is ready to be populated and the second PCB on the second belt conveyor of the second positioning system is being populated.
Figure 31:
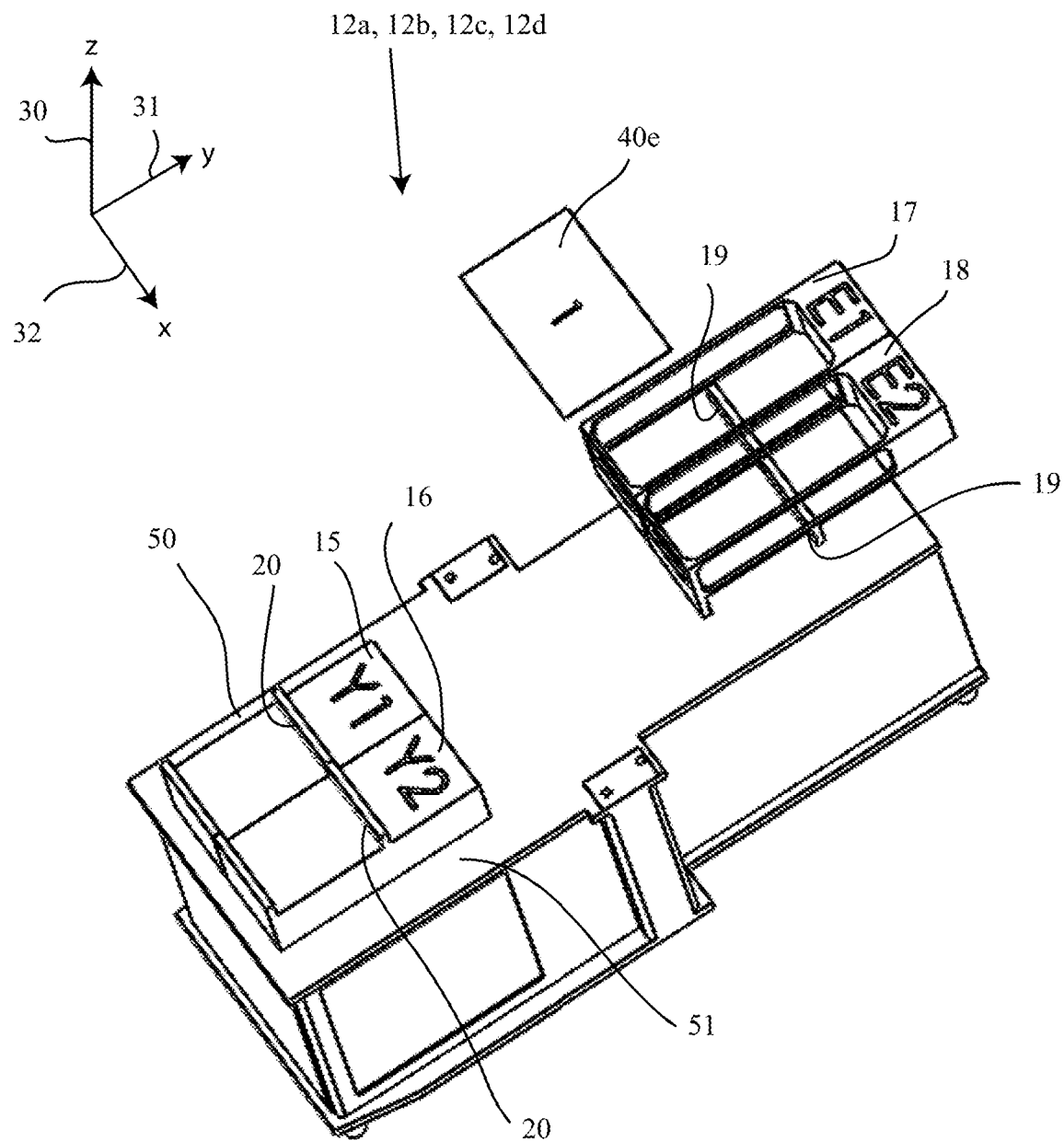
FIG. 31 depicts an embodiment of a placement module operating in a dual placement mode, wherein a PCB arrives at an up-line conveyor.
Figure 32:
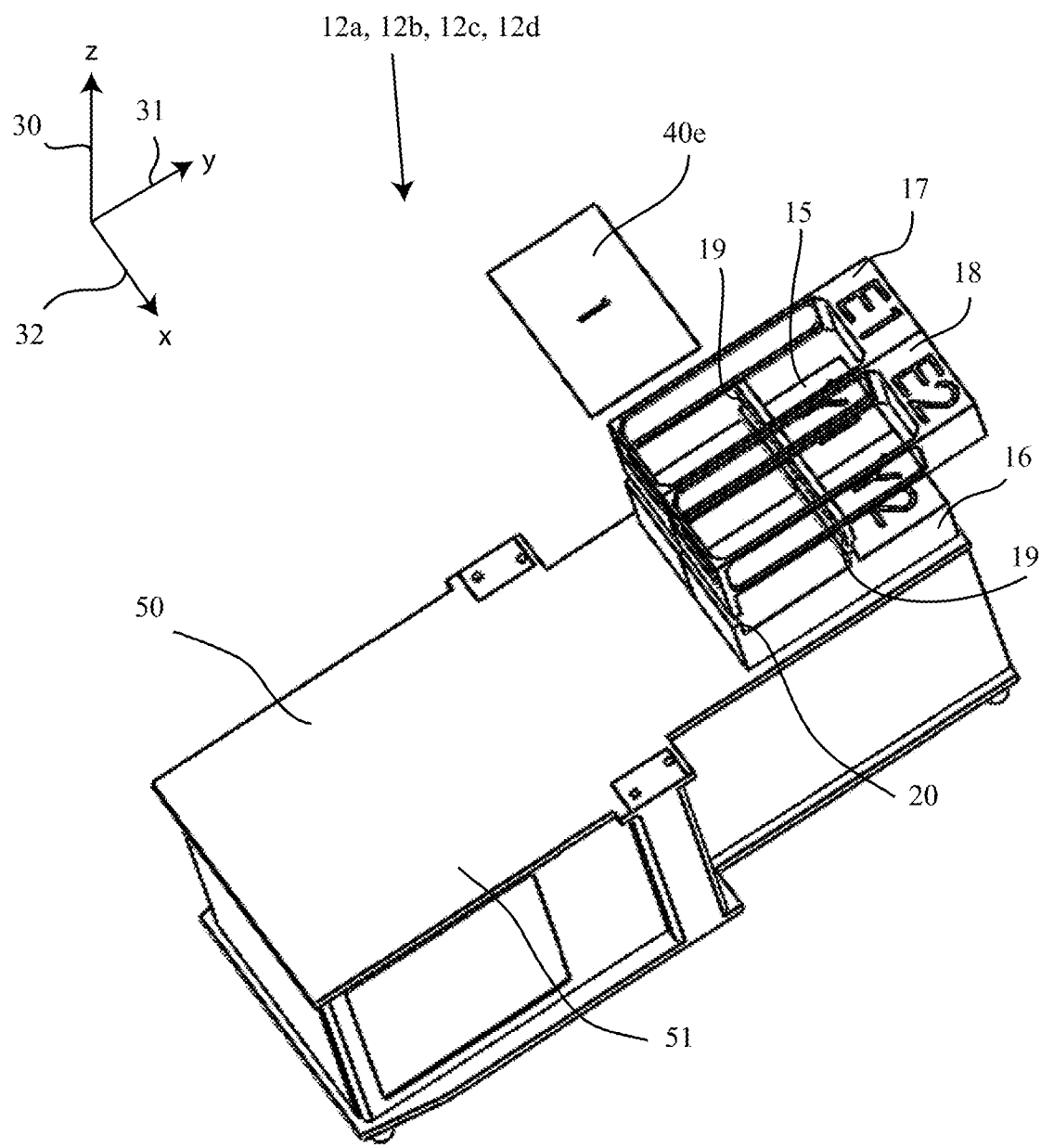
FIG. 32 depicts the embodiment of the placement module of FIG. 31, moving a first belt conveyor of a first positioning system and a second belt conveyor of a second positioning system into alignment to receive the PCB.
Figure 33:
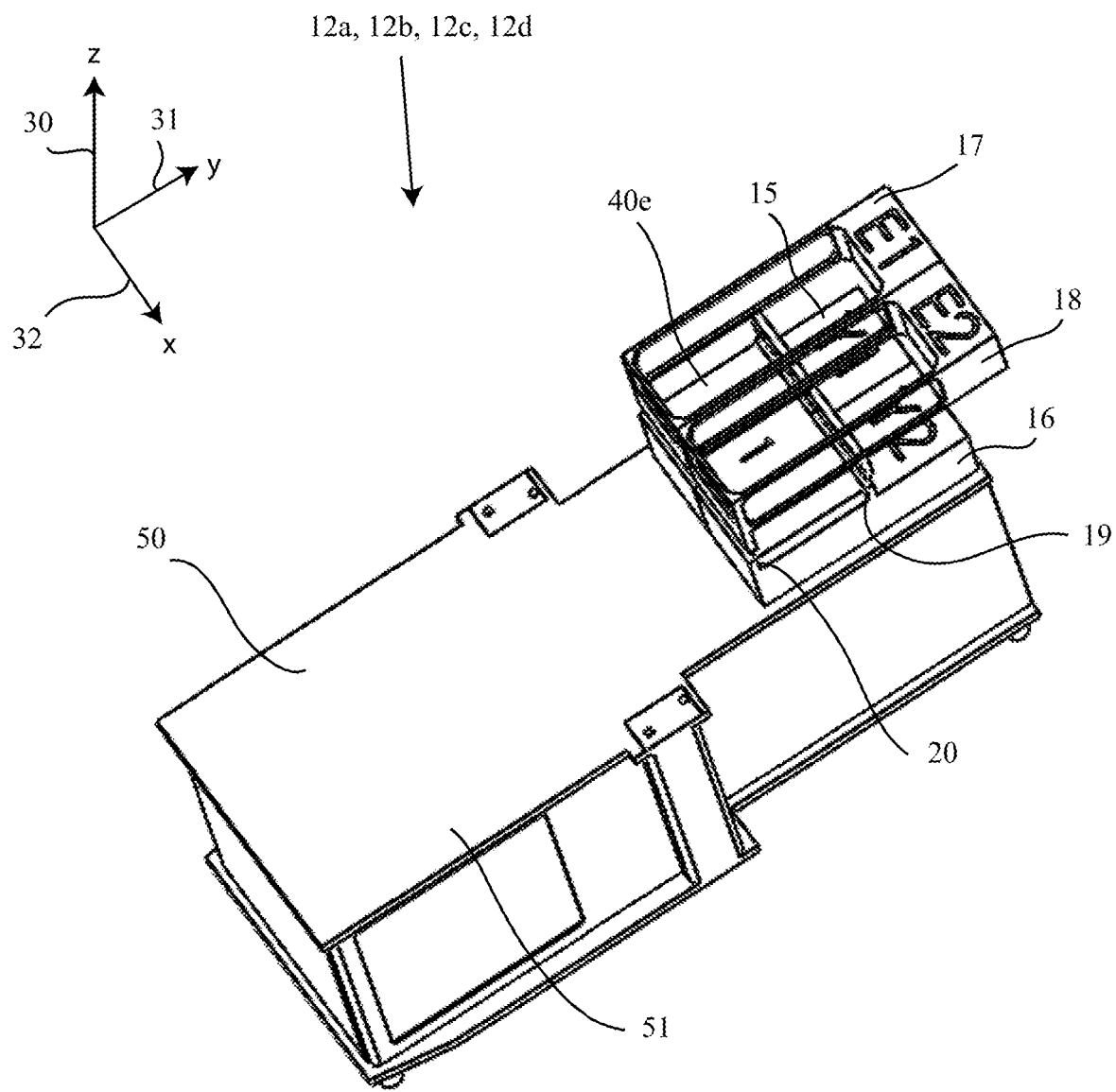
FIG. 33 depicts the embodiment of the placement module of FIG. 32, wherein the PCB is conveyed onto the first and second belt conveyors.
Figure 34:
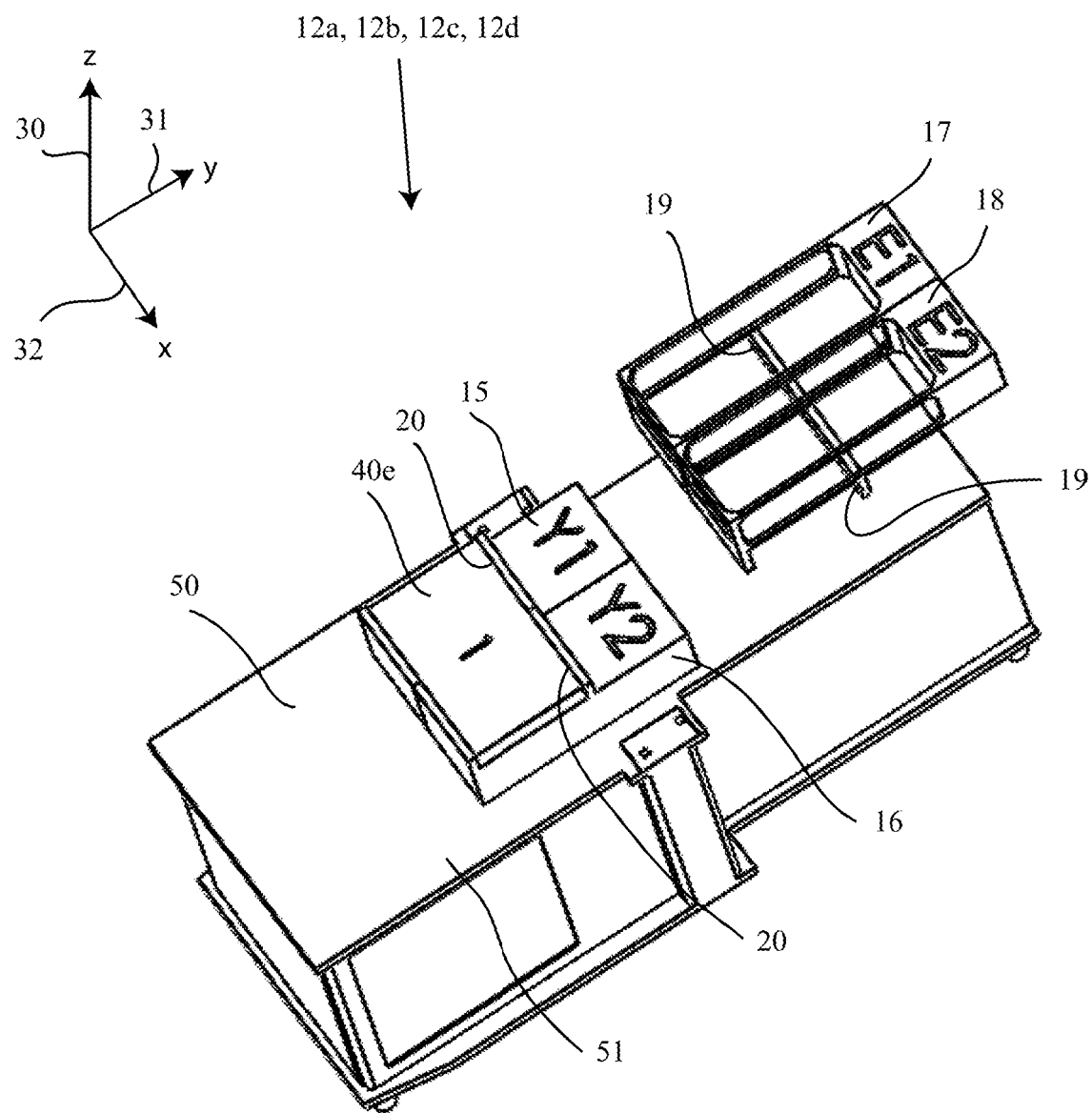
FIG. 34 depicts the embodiment of the placement module of FIG. 33, wherein the first and second belt conveyors move to the placement area of the placement module in unison.
Figure 35:
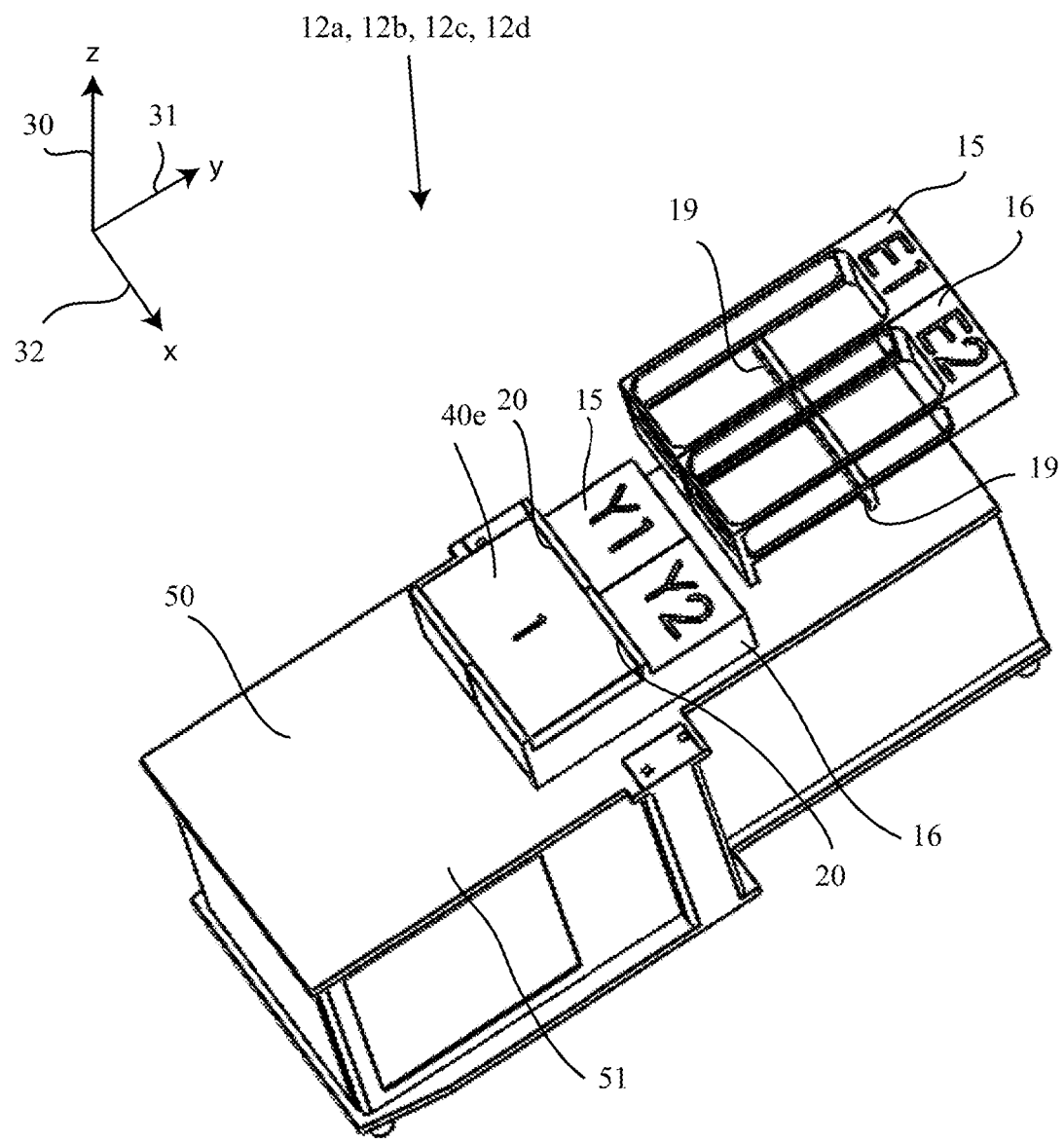
FIG. 35 depicts the embodiment of the placement module of FIG. 34, wherein the first and second belt conveyor comprising the PCB move in perfect alignment during the population of the PCB.
Figure 36:
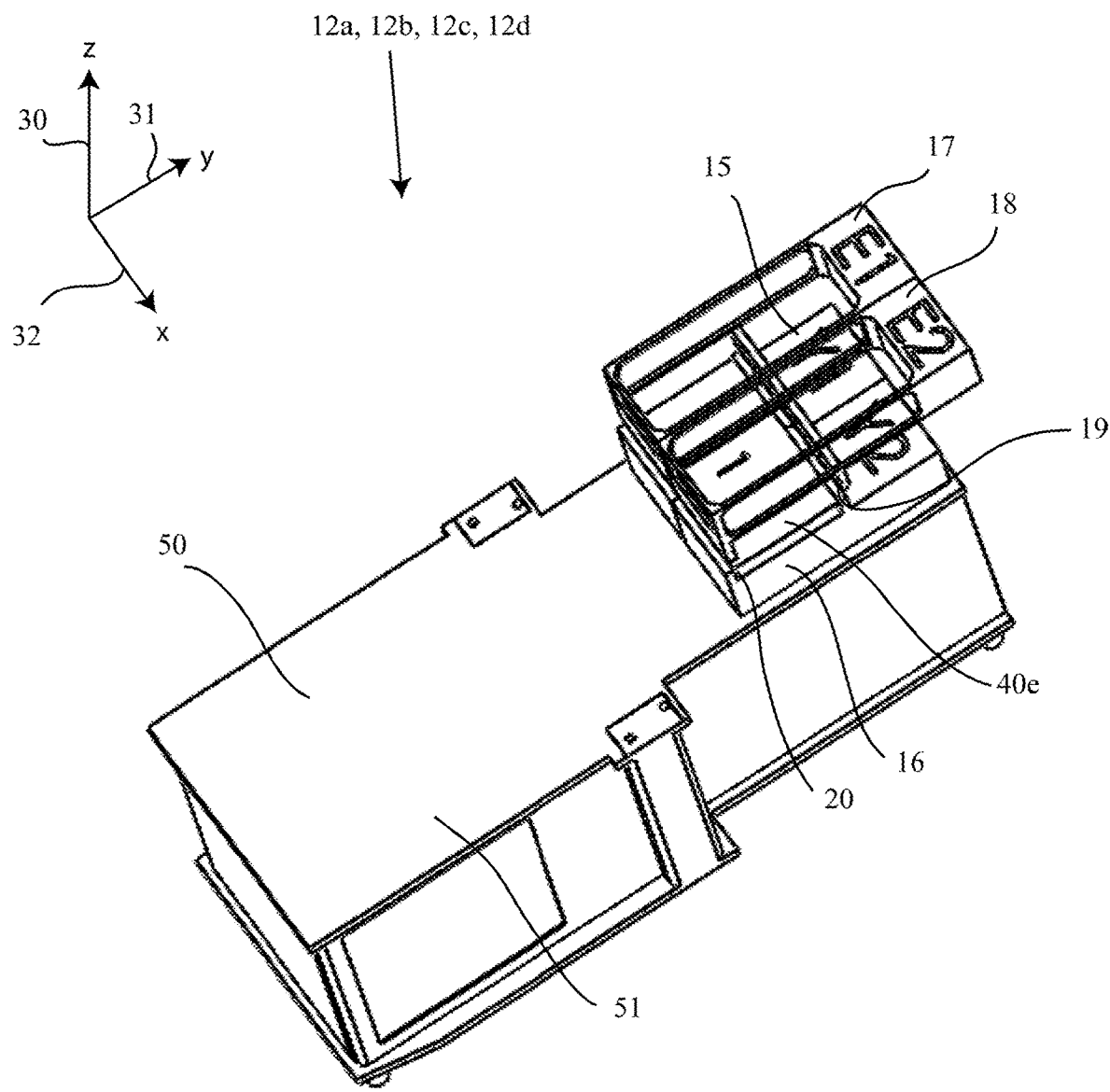
FIG. 36 depicts the embodiment of the placement module of FIG. 35, wherein the first and second belt conveyors move in unison to a transfer position after the completion of the population of the PCB.
Figure 37:
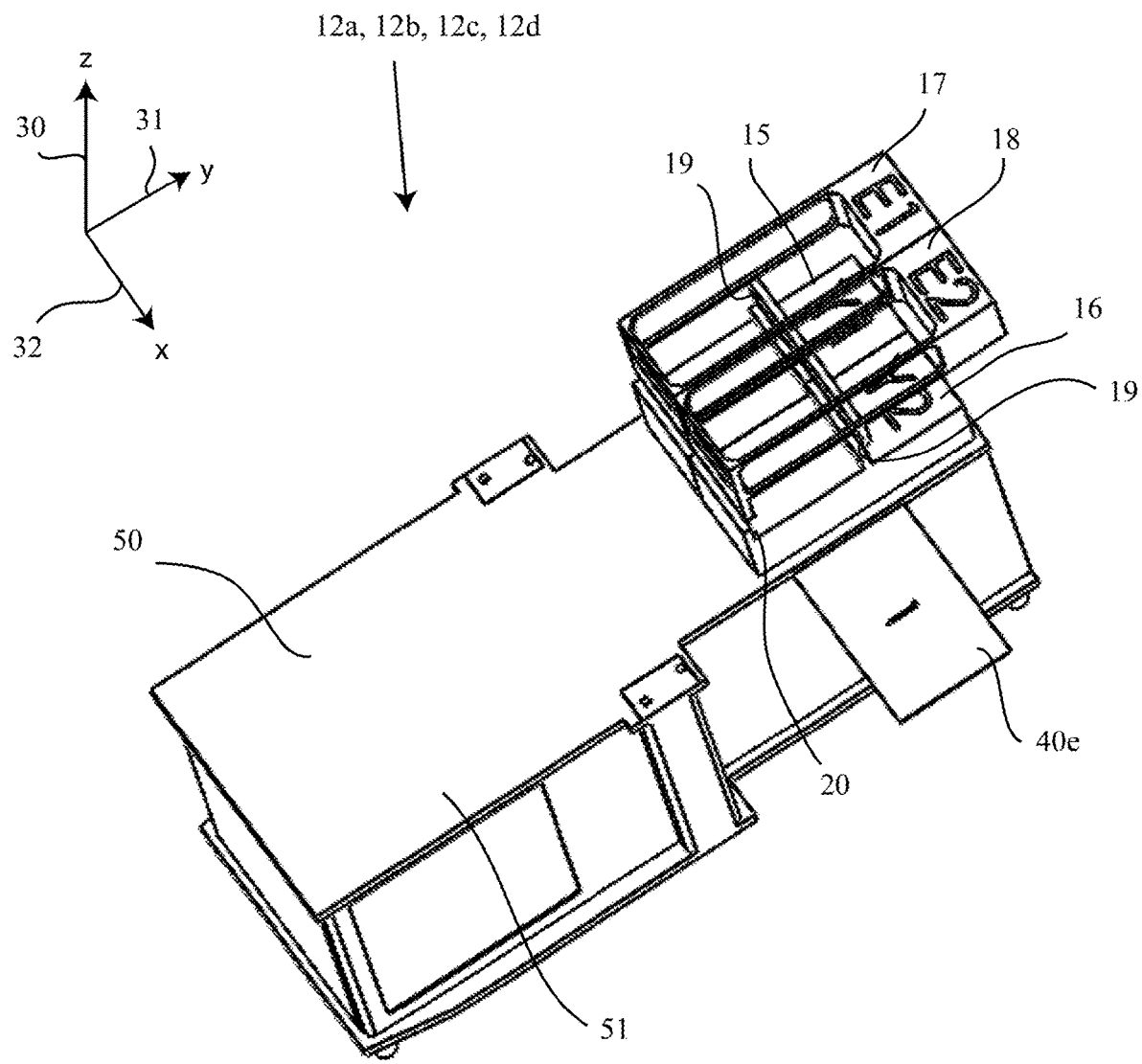
FIG. 37 depicts the embodiment of the placement module of FIG. 36, wherein the first and second belt conveyors convey the PCB to a down line conveyor.

With reference to FIGS. 23-30, the placement module 12, 12b, 12c, 12d is shown receiving PCB 40d from the product conveyance system 14 and providing PCB 40d to the product conveyor system 14 such that PCB 40d bypasses the first positioning system 15 and the second positioning system 16. PCB 40b may bypass the placement module 12a, 12b, 12c, 12d to another placement module 12a, 12b, 12c, 12d. In FIG. 23, while PCB 40c is ready to be at least partially assembled and while PCB 40b is being at least partial assembled, PCB 40d is shown arriving at the product conveyor system 14. As shown in FIG. 24, the first elevator conveyor system 17 may lower to a transfer position to receive PCB 40d while PCB 40c is ready to be at least partially assembled and while PCB 40b is being at least partial assembled. As shown in FIG. 25, the second elevator conveyor system 18 may lower to a transfer position to receive PCB 40d while PCB 40c is ready to be at least partially assembled and while PCB 40b is being at least partial assembled. In FIG. 26, while PCB 40c is ready to be at least partially assembled and while PCB 40b is being at least partial assembled, the first elevator conveyance system 17 is shown receiving PCB 40d by PCB 40d entering the edge belt conveyor 19 of the first elevator conveyance system 17 such that PCB 40 may convey across the first elevator conveyance system 17. In FIG. 27, while PCB 40c is ready to be at least partially assembled and while PCB 40b is being at least partial assembled, the second elevator conveyance system 18 is shown having received PCB 40d by PCB 40d conveying across the first elevator conveyance system 17 to the edge belt conveyor 19 of the second elevator conveyance system 18. As shown in FIG. 28, while PCB 40c is ready to be at least partially assembled and while PCB 40b is being at least partial assembled, PCB 40d is shown being conveyed down the line from the placement module 12a, 12b, 12c, 12d, for example, PCB 40d may be provided to the product conveyance system 14. As shown in FIG. 29, while PCB 40c is ready to be at least partially assembled and while PCB 40b is being at least partial assembled, the first elevator conveyance system 17 may raise into a safe position, and as shown in FIG. 30, while PCB 40c is ready to be at least partially assembled and while PCB 40b is being at least partial assembled, the second elevator conveyance system 18 may raise into a safe position so that PCB 40b on the second positioning system 16 can move to the transfer position and, for example, transfer PCB 40b to the product conveyance system 14. As described supra, in some instances, it may be necessary for a user to assemble a product that is larger than the first positioning system 15 or the second positioning system 16; for example, a product such as a PCB may be larger than the first positioning system 15 or the second positioning system 16. With reference to FIGS. 31-37, the placement module 12, 12b, 12c, 12d is shown operating in a dual placement mode with both the first elevator conveyance system 17 and the second elevator conveyance system 18 in a raised or safe position, receiving PCB 40e from the product conveyance system 14 and at least partially assembling PCB 40e. In FIG. 31, PCB 40e is shown arriving at the product conveyance system 14. In FIG. 32, the first positioning system 15 is shown having moved along the first axis to intersect with the product conveyance system 14 in a transfer position, and the second positioning system 16 is shown having moved along the second axis to intersect with the product conveyance system 14 in a transfer position. As shown in FIG. 33, PCB 40e may be conveyed onto the first positioning system 15 and the second positioning system 16, for example, by entering the edge rail conveyor 20 of the first positioning system 15 and the edge rail conveyor 20 of the second positioning system 16. PCB 40d extends across the first positioning system 15 and the second positioning system 16. As shown in FIG. 34, the first positioning system 15 and the second positioning system 16 may move simultaneously along the first axis and the second axis and maintain an adjacent relationship such that PCB 40e is at a placement location of the placement module 12a, 12b, 12c, 12d. As shown in FIG. 35, PCB 40e may be at least partially assembled, for example, by pick and place heads populating PCB 40e with components. During the at least partial assembly of PCB 40e, the first positioning system 15 and the second positioning system 16 may move in unison. In FIG. 36, the first positioning system 15 and the second positioning system 16 are depicted moving in unison along the first axis and the second axis to a transfer position. In FIG. 37, PCB 40e is shown being conveyed down the line from the placement module 12a, 12b, 12c, 12d, for example, PCB 40e, having been at least partially assembled, may be provided to the product conveyance system 14. It should be understood that during dual placement mode, bypass of a product 40a, 40b, 40c, 40d can take place such that a product 40a, 40b, 40c, 40d passes through the edge belt conveyor 19 of the first elevator conveyance system 17 and the edge belt conveyor 19 of the second elevator conveyance system 18 to the product conveyance system 14 such that the product 40a, 40b, 40c, 40d bypasses the first positioning system 15 and the second positioning system 16.

Figure 4:
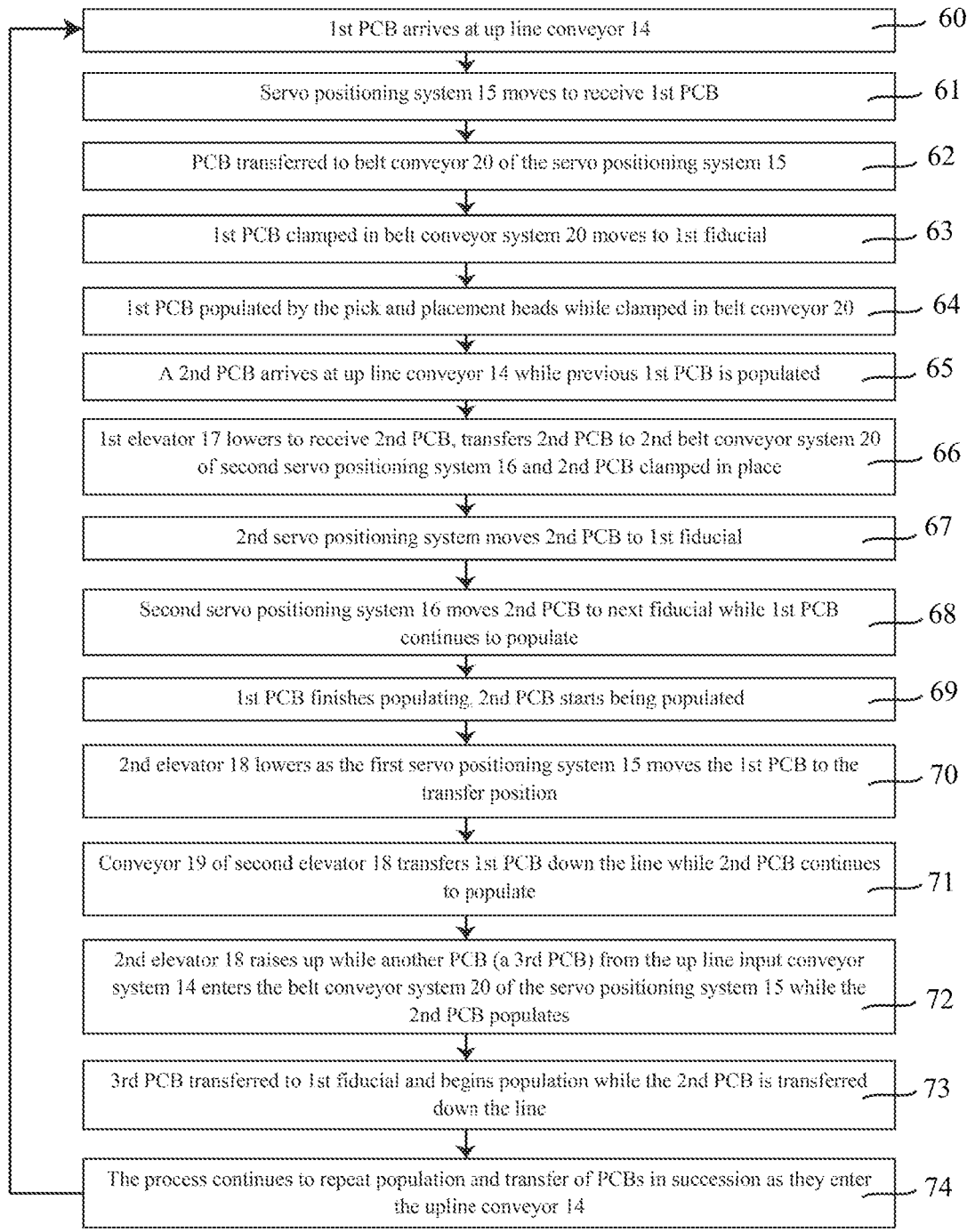
FIG. 4 depicts a sequence of operation for a method for transporting and populating printed circuit boards (PCB) in an electronics assembly system.

With reference to FIG. 4, in one embodiment, a method for transporting and populating products, such as PCBs 40a, 40b, 40c, 40d, in an assembly machine, such as assembly machine 10. The method may include steps 60-74. In step 60, a first PCB arrives at an upline input conveyor such as product conveyance system. In step 61, a first servo positioning system for example, first positioning system 15 may move up to receive the first PCB. In step 62, the first PCB may be transferred to a belt conveyor system, for example, edge belt conveyor 20 of the first servo positioning system. In step 63, the first PCB may be clamped in the belt conveyor system and move to a first placement location such as first placement location 50 such that a first fiducial marker of the first PCB is located, for example, by one or more vision systems of one or more dispensing heads. In step 64, the first PCB may be populated by one or more pick and place heads while the first PCB is clamped in the edge belt conveyor of the first servo positioning system. In step 65, a second PCB such as PCB 40a, 40b, 40c, 40d may arrive at the upline conveyor while the first PCB is being populated. In step 66, a first elevator, such as first elevator conveyance system 17 may lower to receive the second PCB, and the second PCB may transfer to a second belt conveyor system such as the edge belt conveyor of second servo positioning system such as positioning system 16 and the second PCB may be clamped in place by an edge belt conveyor of the second servo positioning system. In step 67, the second servo positioning system, by the second belt conveyor system, may move the second PCB to a second placement location such as second placement location 51 such that a first fiducial marker of the second PCB is located, for example, by one or more vision systems of one or more dispensing heads. In step 68, the second servo positioning system, by the second belt conveyor system may move the second PCB to a second fiducial while the first PCB continues to populate. In step 69, when the first PCB has finished populating, the second PCB may start to be populated. In step 70, a second elevator such as second elevator conveyance system 18 may lower to a transfer position while the first PCB is moved by the first servo positioning system. In step 71, a conveyor such as edge belt conveyor of the second elevator may transfer the first PCB down the line, for example, to the upline input conveyor system, another placement module such as placement module 12a, 12b, 12c, 12d, or other component of the assembly machine. In step 72, the second elevator may raise up while a third PCB, such as PCB 40a, 40b, 40c, 40d, from the upline input conveyor system enters the belt conveyor system of the first servo positioning system while the second PCB is being populated. In step 73, the third PCB may be transferred to a placement location at which a first fiducial marker of the third PCB has been located, for example, by one or more vision systems and the third PCB may begin to be populated while the second PCB is transferred down the line, for example, after completing population, to the up line input conveyor, another placement module, a feeder module such as feeder module 13a, 13b, 13c, 13d, or other component. In step 74, the process shown in FIG. 4 may be continue to repeat population and transfer of more PCBs in succession as they enter the upline conveyor.

In another embodiment, a method of assembly may comprise providing an assembly machine, for example, assembly machine 10 including: a continuous circuitous track, such as track 11; a dispensing head system which may include one or more dispensing heads movable around the continuous circuitous track 11; a product conveyance system such as product conveyance system 14 extending between a first location, for example, first location 11a of the continuous circuitous track 11 and a second location, for example, second location 11b, of the continuous circuitous track; and a placement module, such as placement module 12a, 12b, 12c, or 12d, the placement module including: a first positioning system, such as first positioning system 15; and a second positioning system, for example, second positioning system 16; moving, by the first positioning system, along a first axis that intersects with the product conveyance system; receiving, by the first positioning system, a first product, for example, PCB 40a, 40b, 40c, 40d, 40e from the product conveyance system; moving, by the first positioning system, the first product from the product conveyance system to a first placement location, such as first placement location 50; moving, by the second positioning system, along a second axis that intersects with the product conveyance system; receiving, by the second positioning system, a second product, for example, PCB 40a, 40b, 40c, 40d, 40e, from the product conveyance system; moving, by the second positioning system, the second product from the product conveyance system to a second placement location, for example, second placement location; and at least partially assembling, by the dispensing head system, the first product, and the second product. A method of assembly may comprise moving, by the placement module, the second positioning system independently of the first positioning system; and moving, by the placement module, the first positioning system independently of the second positioning system. In the method of assembly, the first axis may be parallel to the second axis and the product conveyance system may be perpendicular to the first axis and the second axis.

A method of assembly may comprise mechanically attaching a second placement module, such as placement module to the placement module such the second placement module is configured to receive at least one of a first product and a second product.

In a method of assembly, the assembly machine may further include a first elevator conveyance system, such as first elevator conveyance system 17 and a second elevator conveyance system, such as second elevator conveyance system 18, and the method may comprise receiving, by the first elevator conveyance system, at least one of a first product such as PCB 40a, 40b, 40c, 40d, 40e and a second product such as PCB 40a, 40b, 40c, 40d, 40e from the product conveyance system; providing, by the second elevator conveyance system, at least one of the first product and the second product to the product conveyance system.

In a method of assembly, one or more dispensing heads may each include a vision system, and the method of assembly further may comprise acquiring, by the vision system, the position of the second product during at least partially assembling, by the one or more dispensing heads, the first product.

A method of assembly may comprise at least partially assembling, by the dispensing head system, a first product; and at least partially assembling, by the dispensing head system, a second product immediately after completing the first product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An assembly machine comprising:
a continuous circuitous track;
a dispensing head system configured to at least partially assemble products, wherein the dispensing head system includes one or more dispensing heads moveable around the continuous circuitous track;
a product conveyance system extending between a first location of the continuous circuitous track and a second location of the continuous circuitous track and
a placement module, the placement module including:
a first positioning system including a conveyor, the first positioning system configured to move along a first axis that intersects with the product conveyance system, wherein the first positioning system is configured to receive a first of the products from the product conveyance system and move the first of the products from the product conveyance system to a first placement location;
a second positioning system including a conveyor, the second positioning system configured to move along a second axis that intersects with the product conveyance system, wherein the second positioning system is configured to receive a second of the products from the product conveyance system and move the second of the products from the product conveyance system to a second placement location; and
a first elevator conveyance system and a second elevator conveyance system, wherein the first elevator conveyance system is configured to move vertically along a fourth axis and the second elevator conveyance system is configured to move vertically along a fifth axis, wherein the first elevator conveyance system is configured to receive products from the product conveyance system, wherein the second elevator conveyance system is configured to provide products to the product conveyance system.

2. The assembly machine of claim 1, wherein the second positioning system is configured to move the second of the products from the product conveyance system to the second placement location while the first of the products is being at least partially assembled on the first positioning system by the dispensing head system.

3. The assembly machine of claim 1, wherein the first axis is parallel to the second axis and the product conveyance system extends along a third axis perpendicular to the first axis and the second axis.

4. The assembly machine of claim 1, wherein the second positioning system is configured to move independently of the first positioning system.

5. The assembly machine of claim 1, further comprising a second placement module, wherein the placement module is modular and mechanically attachable and wherein the second placement module is modular and mechanically-attachable.

6. The assembly machine of claim 1, wherein the first elevator conveyance system is configured receive at least one of the products from the product conveyance system and move the at least one of the products to the second positioning system; and wherein the second elevator conveyance system is configured to receive at least one of the products from the first positioning system.

7. The assembly machine of claim 1, wherein the first elevator conveyance system and the second elevator conveyance system are configured to receive at least one of the products and move the at least one of the products such that the at least one of the products bypasses the first positioning system and the second positioning system.

8. The assembly machine of claim 1, wherein the second elevator conveyance system is configured to move independently of the first elevator conveyance system, and wherein the first elevator conveyance system and the second elevator conveyance system are configured to move independently of the first positioning system and the second positioning system.

9. The assembly machine of claim 1, wherein the first positioning system and the second positioning system are configured to collectively receive a third of the products from the product conveyance system such that the third of the products extends across the first positioning system and the second positioning system, wherein the first positioning system and the second positioning system are configured to move simultaneously along the first axis and second axis and maintain an adjacent relationship after receiving the third of the products.

10. A method of assembly comprising:
providing an assembly machine including:
  a continuous circuitous track;
  a dispensing head system, wherein the dispensing head system includes one or more dispensing heads moveable around the continuous circuitous track;
  a product conveyance system extending between a first location of the continuous circuitous track and a second location of the continuous circuitous track;
  a placement module, the placement module including:
    a first positioning system; and
    a second positioning system; and
  a first elevator conveyance system and a second elevator conveyance system;
moving, by the first positioning system, a first product along a first axis that intersects with the product conveyance system;
receiving, by the first positioning system, the first product from the product conveyance system;
moving, by the first positioning system, the first product from the product conveyance system to a first placement location;
moving, by the second positioning system, a second product along a second axis that intersects with the product conveyance system;
receiving, by the second positioning system, the second product from the product conveyance system;
moving, by the second positioning system, the second product from the product conveyance system to a second placement location;
at least partially assembling, by the dispensing head system, the first product and the second product;
receiving, by the first elevator conveyance system, at least one of the first product and the second product from the product conveyance system; and
providing, by the second elevator conveyance system, at least one of the first product and the second product to the product conveyance system.

11. The method of assembly of claim 10, further comprising:
moving, by the placement module, the second positioning system independently of the first positioning system; and
moving, by the placement module, the first positioning system independently of the second positioning system.

12. The method of assembly of claim 10, wherein the first axis is parallel to the second axis and the product conveyance system is perpendicular to the first axis and the second axis.

13. The method of assembly of claim 10, wherein the one or more dispensing heads each include a vision system, the method of assembly further comprising:
acquiring, by the vision system, the position of the second product during at least partially assembling, by the one or more dispensing heads, the first product.

* * * * *